(12) United States Patent
Frodis

(10) Patent No.: US 12,000,865 B2
(45) Date of Patent: Jun. 4, 2024

(54) MULTI-BEAM VERTICAL PROBES WITH INDEPENDENT ARMS FORMED OF A HIGH CONDUCTIVITY METAL FOR ENHANCING CURRENT CARRYING CAPACITY AND METHODS FOR MAKING SUCH PROBES

(71) Applicant: Microfabrica Inc., Van Nuys, CA (US)

(72) Inventor: Uri Frodis, Los Angeles, CA (US)

(73) Assignee: Microfabrica Inc., Van Nuys (CA)

( * ) Notice: Subject to any disclaimer, the term of this patent is extended or adjusted under 35 U.S.C. 154(b) by 178 days.

(21) Appl. No.: 17/488,176

(22) Filed: Sep. 28, 2021

(65) Prior Publication Data
US 2024/0103040 A1 Mar. 28, 2024

Related U.S. Application Data

(63) Continuation-in-part of application No. 17/320,173, filed on May 13, 2021, now Pat. No. 11,828,775, and
(Continued)

(51) Int. Cl.
*G01R 1/067* (2006.01)
*G01R 1/073* (2006.01)
*G01R 3/00* (2006.01)

(52) U.S. Cl.
CPC ..... *G01R 1/06761* (2013.01); *G01R 1/06744* (2013.01); *G01R 1/07314* (2013.01); *G01R 3/00* (2013.01)

(58) Field of Classification Search
CPC ............ G01R 1/06761; G01R 1/06744; G01R 1/07314; G01R 3/00
(Continued)

(56) References Cited

U.S. PATENT DOCUMENTS 4,027,935 A 6/1977 Byrnes et al.
4,116,523 A 9/1978 Coberly et al.
(Continued)

FOREIGN PATENT DOCUMENTS

JP 4014040 A2 1/1992
JP 2734412 B2 3/1998
(Continued)

OTHER PUBLICATIONS

(01) Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.
(Continued)

*Primary Examiner* — Christopher P McAndrew
(74) *Attorney, Agent, or Firm* — Greenberg Traurig

(57) ABSTRACT

Vertical probes, formed of at least one layer that longitudinally includes a first and a second end and a central portion, with the central portion including at least three compliant arms wherein each of the two outer arms include a material having a yield strength greater than a first amount and the at least one intermediate arm is formed of a material having a yield strength less than the first yield strength amount wherein a yield strength of the material of the intermediate arm has a ratio to that of an outer arm of less than 1, more preferably less than 0.8, even more preferably less than 0.6, and most preferably less than 0.4.

21 Claims, 19 Drawing Sheets

Related U.S. Application Data a continuation-in-part of application No. 17/240,962, filed on Apr. 26, 2021, now Pat. No. 11,821,918, and a continuation-in-part of application No. 16/791,288, filed on Feb. 14, 2020, now abandoned.

(60) Provisional application No. 63/024,456, filed on May 13, 2020, provisional application No. 63/015,450, filed on Apr. 24, 2020, provisional application No. 62/805,589, filed on Feb. 14, 2019.

(58) Field of Classification Search
USPC .................................................. 324/755.06
See application file for complete search history.

(56) References Cited

U.S. PATENT DOCUMENTS

| | | | |
|---|---|---|---|
| 4,737,114 A | 4/1988 | Yaegashi | |
| 4,773,877 A | 9/1988 | Kruger et al. | |
| 4,821,411 A | 4/1989 | Yaegashi | |
| 4,952,272 A | 8/1990 | Okino et al. | |
| 5,177,438 A | 1/1993 | Littlebury et al. | |
| 5,286,208 A | 2/1994 | Matsuoka | |
| 5,321,685 A | 6/1994 | Nose et al. | |
| 5,476,211 A | 12/1995 | Khandros | |
| 5,513,430 A | 5/1996 | Yanof et al. | |
| 5,599,194 A | 2/1997 | Ozawa et al. | |
| 5,605,614 A | 2/1997 | Bornand | |
| 5,811,982 A | 9/1998 | Beaman et al. | |
| 5,865,641 A | 2/1999 | Swart et al. | |
| 5,892,223 A | 4/1999 | Karpov et al. | |
| 5,917,707 A | 6/1999 | Khandros et al. | |
| 5,952,843 A | 9/1999 | Vinh | |
| 5,994,152 A | 11/1999 | Khandros et al. | |
| 6,043,563 A | 3/2000 | Eldridge et al. | |
| 6,184,053 B1 | 2/2001 | Eldridge et al. | |
| 6,208,155 B1 | 3/2001 | Barabi et al. | |
| 6,218,203 B1 | 4/2001 | Khoury et al. | |
| 6,250,933 B1 | 6/2001 | Khoury et al. | |
| 6,255,126 B1 | 7/2001 | Mathieu et al. | |
| 6,264,477 B1 | 7/2001 | Smith et al. | |
| 6,268,015 B1 | 7/2001 | Mathieu et al. | |
| 6,294,922 B1 * | 9/2001 | Okubo | G01R 1/07357 |
| | | | 324/755.06 |
| 6,299,458 B1 | 10/2001 | Yamagami et al. | |
| 6,329,827 B1 | 12/2001 | Beaman et al. | |
| 6,336,269 B1 | 1/2002 | Eldridge et al. | |
| 6,358,097 B1 | 3/2002 | Peters | |
| 6,414,501 B2 | 7/2002 | Kim et al. | |
| 6,417,684 B1 * | 7/2002 | Schmid | G01R 1/07357 |
| | | | 324/750.25 |
| 6,426,638 B1 | 7/2002 | Di Stefano | |
| 6,482,013 B2 | 11/2002 | Eldridge et al. | |
| 6,491,968 B1 | 12/2002 | Mathieu et al. | |
| 6,507,207 B2 | 1/2003 | Nguyen | |
| 6,520,778 B1 | 2/2003 | Eldridge et al. | |
| 6,560,861 B2 | 5/2003 | Fork et al. | |
| 6,573,738 B1 | 6/2003 | Matsuo et al. | |
| 6,624,645 B2 | 9/2003 | Haseyama et al. | |
| 6,626,708 B2 | 9/2003 | Phillips | |
| 6,651,325 B2 | 11/2003 | Lee et al. | |
| 6,672,876 B1 | 1/2004 | Takekoshi | |
| 6,690,185 B1 | 2/2004 | Khandros et al. | |
| 6,720,781 B2 | 4/2004 | Ott et al. | |
| 6,758,682 B1 | 7/2004 | Kosmala | |
| 6,771,084 B2 | 8/2004 | Di Stefano | |
| 6,777,319 B2 | 8/2004 | Grube et al. | |
| 6,783,405 B1 | 8/2004 | Yen | |
| 6,784,378 B2 | 8/2004 | Zhu et al. | |
| 6,787,456 B1 | 9/2004 | Kripesh et al. | |
| 6,807,734 B2 | 10/2004 | Eldridge et al. | |
| 6,811,406 B2 | 11/2004 | Grube | |
| 6,844,748 B2 | 1/2005 | Sato et al. | |
| 6,855,010 B1 | 2/2005 | Yen | |
| D507,198 S | 7/2005 | Kister | |
| 6,935,901 B2 | 8/2005 | Simpson et al. | |
| 6,967,492 B2 | 11/2005 | Tsui et al. | |
| 6,998,857 B2 | 2/2006 | Terada et al. | |
| 7,047,638 B2 | 5/2006 | Eldridge et al. | |
| 7,063,541 B2 | 6/2006 | Grube et al. | |
| 7,091,729 B2 | 8/2006 | Kister | |
| 7,098,540 B1 | 8/2006 | Mohan et al. | |
| 7,126,220 B2 | 10/2006 | Lahiri et al. | |
| 7,131,848 B2 | 11/2006 | Lindsey et al. | |
| 7,148,709 B2 | 12/2006 | Kister | |
| 7,172,431 B2 | 2/2007 | Beaman et al. | |
| 7,220,134 B2 | 5/2007 | Goodman et al. | |
| 7,256,593 B2 | 8/2007 | Treibergs | |
| 7,273,812 B2 | 9/2007 | Kim et al. | |
| 7,279,917 B2 | 10/2007 | Williams et al. | |
| 7,326,327 B2 | 2/2008 | Armstrong et al. | |
| 7,412,767 B2 | 8/2008 | Kim et al. | |
| 7,435,102 B2 | 10/2008 | Goodman | |
| 7,436,192 B2 | 10/2008 | Kister | |
| 7,437,813 B2 | 10/2008 | Tunaboylu et al. | |
| 7,446,548 B2 | 11/2008 | Chen | |
| 7,449,910 B2 | 11/2008 | Kirby et al. | |
| 7,456,642 B2 | 11/2008 | Saulnier et al. | |
| 7,462,800 B2 | 12/2008 | Tunaboylu et al. | |
| 7,504,839 B2 | 3/2009 | Feigenbaum et al. | |
| 7,504,840 B2 | 3/2009 | Arat et al. | |
| 7,531,077 B2 | 5/2009 | Cohen et al. | |
| 7,533,462 B2 | 5/2009 | Gleason et al. | |
| 7,557,595 B2 | 7/2009 | Chen et al. | |
| 7,579,856 B2 | 8/2009 | Khandros et al. | |
| 7,583,098 B2 | 9/2009 | Tunaboylu et al. | |
| 7,628,620 B2 | 12/2009 | Gritters | |
| 7,629,807 B2 | 12/2009 | Hirakawa et al. | |
| 7,637,007 B2 | 12/2009 | Tunaboylu et al. | |
| 7,638,028 B2 | 12/2009 | Tunaboylu et al. | |
| 7,674,112 B2 | 3/2010 | Gritters et al. | |
| 7,690,925 B2 | 4/2010 | Goodman | |
| 7,721,430 B2 | 5/2010 | Chartarifsky et al. | |
| 7,731,546 B2 | 6/2010 | Grube et al. | |
| 7,733,101 B2 | 6/2010 | Kister | |
| 7,798,822 B2 | 9/2010 | Eldridge et al. | |
| 7,808,261 B2 | 10/2010 | Kimoto | |
| 7,841,863 B2 | 11/2010 | Mathieu et al. | |
| 7,850,460 B2 | 12/2010 | Weiland et al. | |
| 7,851,794 B2 | 12/2010 | Hobbs | |
| 7,888,958 B2 | 2/2011 | Souma et al. | |
| 7,922,544 B2 | 4/2011 | Chung | |
| 7,928,751 B2 | 4/2011 | Hsu | |
| 7,956,288 B2 | 6/2011 | Kazama et al. | |
| 8,012,331 B2 | 9/2011 | Lee et al. | |
| 8,111,080 B2 | 2/2012 | Kister | |
| 8,159,246 B2 * | 4/2012 | Wen | G01R 1/0416 |
| | | | 324/755.06 |
| 8,299,394 B2 | 10/2012 | Theppakuttai et al. | |
| 8,415,963 B2 | 4/2013 | Kister | |
| 8,427,186 B2 | 4/2013 | McFarland | |
| 8,451,017 B2 | 5/2013 | Gleason et al. | |
| 8,519,727 B2 * | 8/2013 | Yamamoto | G01R 1/06722 |
| | | | 324/755.05 |
| 8,613,846 B2 | 12/2013 | Wu et al. | |
| 8,717,054 B2 | 5/2014 | Chen et al. | |
| 8,717,055 B2 | 5/2014 | Chen et al. | |
| 8,723,543 B2 | 5/2014 | Chen et al. | |
| 8,729,916 B2 | 5/2014 | Chen et al. | |
| 8,742,272 B2 | 6/2014 | English et al. | |
| 8,926,379 B2 | 1/2015 | Vinther | |
| 9,030,222 B2 | 5/2015 | Eldridge et al. | |
| 9,052,342 B2 | 6/2015 | Fan et al. | |
| 9,097,740 B2 | 8/2015 | Kister | |
| 9,121,868 B2 | 9/2015 | Kister | |
| 9,244,101 B2 | 1/2016 | Cohen et al. | |
| 9,316,670 B2 | 4/2016 | Kister | |
| 9,476,911 B2 | 10/2016 | Kister | |
| RE46,221 E | 11/2016 | Kister | |
| 9,540,233 B2 | 1/2017 | Kumar et al. | |
| 9,671,429 B2 | 6/2017 | Wu et al. | |
| 9,702,904 B2 | 7/2017 | Breinlinger et al. | |
| 9,972,933 B2 | 5/2018 | Kimura et al. | |
| 10,215,775 B2 | 2/2019 | Wu et al. | |

(56) References Cited

U.S. PATENT DOCUMENTS

| | | |
|---|---|---|
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 11,262,383 B1 | 3/2022 | Smalley |
| 2002/0196038 A1 | 12/2002 | Okuno et al. |
| 2003/0001606 A1 | 1/2003 | Bende et al. |
| 2004/0051541 A1 | 3/2004 | Zhou et al. |
| 2005/0070170 A1 | 3/2005 | Zhang et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0170440 A1 | 8/2006 | Sudin |
| 2007/0144841 A1 | 6/2007 | Chong et al. |
| 2007/0200576 A1 | 8/2007 | Laurent et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2009/0066351 A1 | 3/2009 | Arat et al. |
| 2009/0079455 A1 | 3/2009 | Gritters |
| 2009/0197484 A1* | 8/2009 | Chen ............... G01R 1/06716 |
| | | 29/874 |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0176122 A1 | 7/2012 | Hirata et al. |
| 2012/0242363 A1 | 9/2012 | Breinlinger et al. |
| 2012/0286816 A1* | 11/2012 | Kister ............... G01R 1/07357 |
| | | 219/121.72 |
| 2014/0062519 A1* | 3/2014 | Ding ............... G01R 1/07357 |
| | | 324/755.06 |
| 2014/0132300 A1* | 5/2014 | Cros ............... G01R 1/07357 |
| | | 324/755.05 |
| 2014/0139250 A1 | 5/2014 | Yaglioglu et al. |
| 2014/0231264 A1 | 8/2014 | Chen et al. |
| 2014/0239995 A1* | 8/2014 | Swart ............... G01R 1/07357 |
| | | 324/755.06 |
| 2017/0346211 A1 | 11/2017 | Kimura et al. |
| 2020/0241042 A1 | 7/2020 | Jeong et al. |
| 2023/0028352 A1 | 1/2023 | Vallauri et al. |

FOREIGN PATENT DOCUMENTS

| | | | |
|---|---|---|---|
| JP | 2001337110 A | 12/2001 | |
| JP | 2004156993 A | 6/2004 | |
| JP | 2004340617 A | 12/2004 | |
| JP | 2004340654 A | 12/2004 | |
| JP | 2008032400 A | 2/2008 | |
| JP | 2012173263 | 9/2012 | |
| WO | 07097559 A1 | 8/2007 | |

OTHER PUBLICATIONS

(02) Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

(03) "Microfabrication—Rapid Prototyping's Killer Application", Rapid Prototyping Report, CAD/CAM Publishing, Inc., Jun. 1999, pp. 1-5.

(04) Adam L. Cohen, "3-D Micromachining by Electrochemical Fabrication", Micromachine Devices, Mar. 1999, pp. 6-7.

(05) Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

(06) F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

(07) Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

(08) F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

(09) Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of the Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

International Search Report and Written Opinion, PCT/US2023/029499, mailed on Feb. 27, 2024.

* cited by examiner

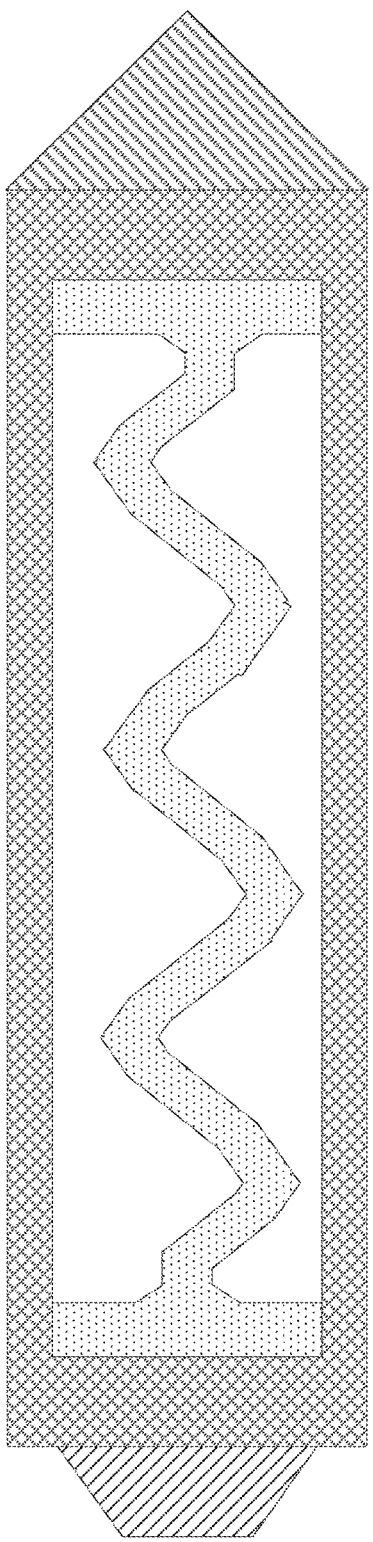
FIG. 6A
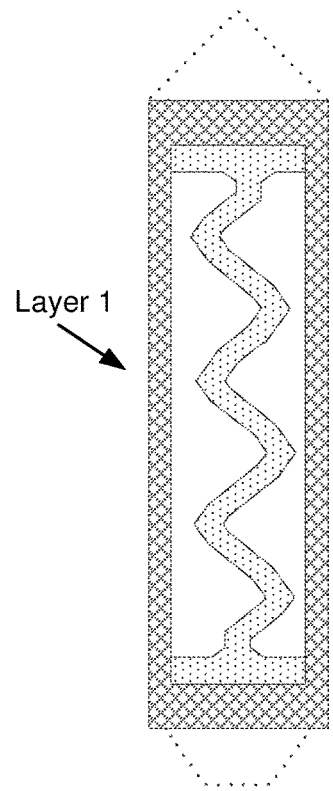
FIG. 6B1
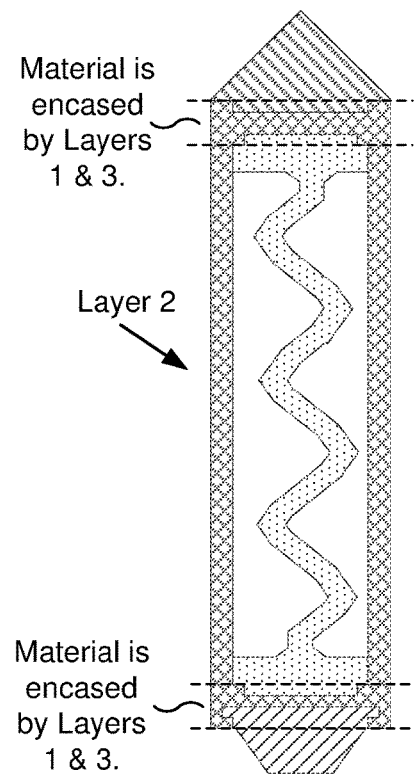
Material is encased by Layers 1 & 3.
Material is encased by Layers 1 & 3.
FIG. 6B2
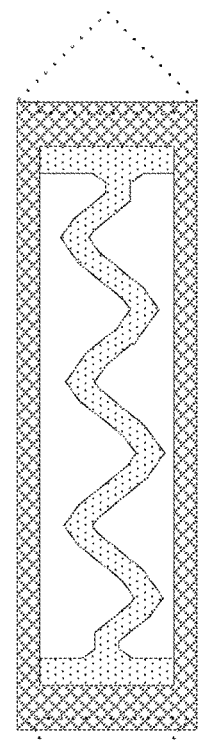
FIG. 6B3

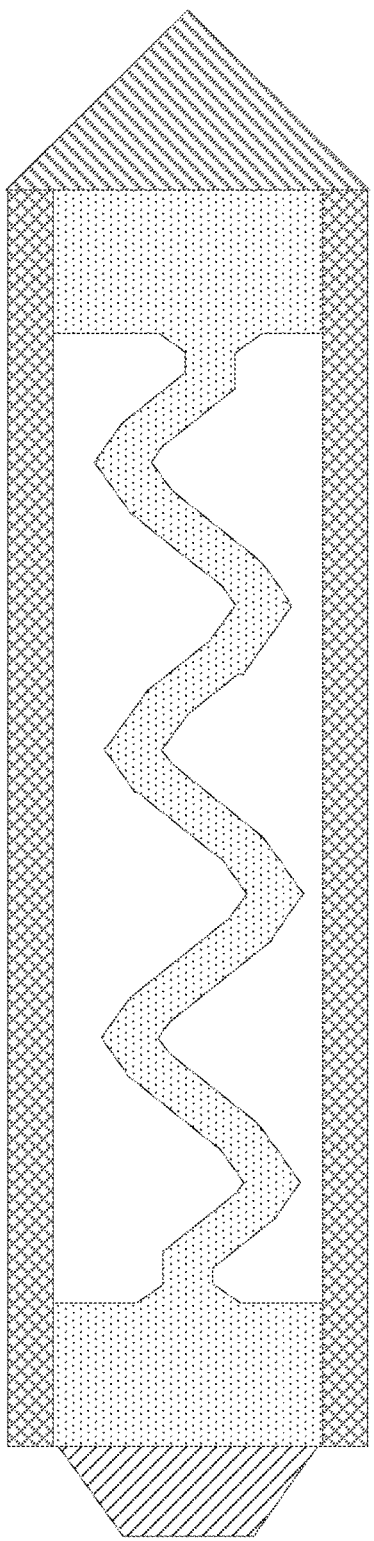
FIG. 7A
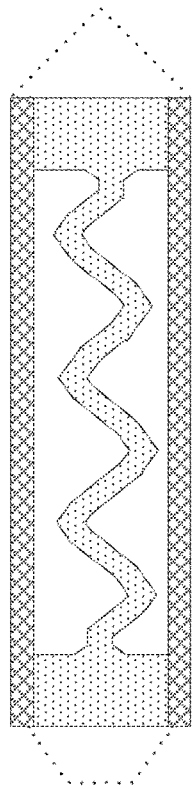
FIG. 7B1
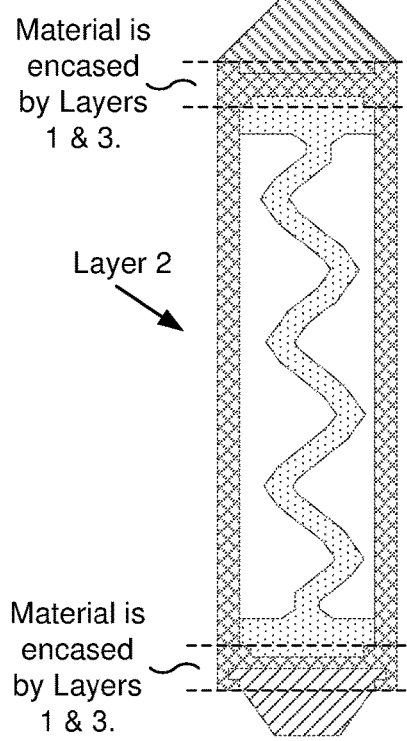
Material is encased by Layers 1 & 3.
Material is encased by Layers 1 & 3.
FIG. 7B2
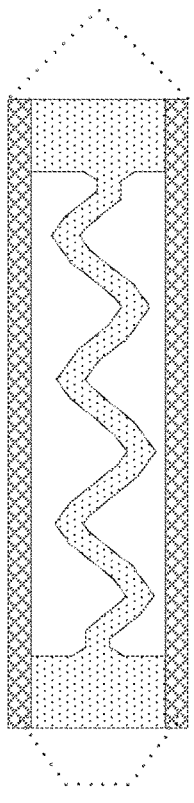
FIG. 7B3

MULTI-BEAM VERTICAL PROBES WITH INDEPENDENT ARMS FORMED OF A HIGH CONDUCTIVITY METAL FOR ENHANCING CURRENT CARRYING CAPACITY AND METHODS FOR MAKING SUCH PROBES

RELATED APPLICATIONS

This application is a continuation-in-part of U.S. patent application Ser. No. 16/791,288, filed Feb. 14, 2020 which claims the benefit of U.S. Provisional Patent Application No. 62/805,589, filed Feb. 14, 2019; this application is also a continuation-in-part of U.S. patent application Ser. No. 17/240,962, filed Apr. 26, 2021, which claims benefit of U.S. Provisional Patent Application No. 63/015,450, filed on Apr. 24, 2020; this application is also a continuation-in-part of U.S. patent application Ser. No. 17/320,173, filed May 13, 2021, which claims benefit of U.S. Patent Application No. 63/024,456, filed on May 13, 2020. These referenced applications are incorporated herein by reference as if set forth in full herein.

FIELD OF THE INVENTION

The present disclosure relates generally to the field of probes for testing electronic devices (e.g. semiconductor devices) and more particularly to multi-beam (or multi-arm) vertical probes, and it relates to electrochemically fabricating such probes as multi-layer three dimensional (e.g. micro-scale or meso-scale) structures where each layer is formed from a plurality of deposited materials.

BACKGROUND OF THE INVENTION

Probes:

Probes of various types have been fabricated and used, or have been proposed for use, in the testing of semiconductors devices at both the wafer and packaged level. As the semiconductor industry continues to drive integrated circuit complexity up and size down (more transistors per unit area), a need exists for new and improved probe designs for contacting such devices for testing purposes and/or for making permanent contact with such devices. This need drives probes to smaller sizes (smaller X and Z cross-sectional dimensions and sometimes to shorter lengths, or longitudinal dimensions, in Y), lower contact force, less scrubbing or more controlled scrubbing, while still maintaining high current carrying capacity so that shorts in failed semiconductor devices do not damage the probes. A need exists for improved probes that can meet the new challenges that that semiconductor industry advancements are driving.

Numerous electrical contact probe and pin configurations as well as array formation methods have been commercially used or proposed, some of which may be prior art while others are not. Examples of such pins, probes, arrays, and methods of making are set forth in the following patent applications, publications of applications, and patents. Each of these applications, publications, and patents is incorporated herein by reference as if set forth in full herein.

| U.S. patent application Ser. No., Filing Date U.S. application Pub No., Pub Date U.S. Pat. No., Pub Date | First Named Inventor, "Title" |
|---|---|
| 10/772,943 - Feb. 4, 2004 2005-0104609 - May 19, 2005 | Arat, et al., "Electrochemically Fabricated Microprobes" |
| 10/949,738 - Sep. 24, 2004 2006-0006888 - Jan. 12, 2006 | Kruglick, et al., "Electrochemically Fabricated Microprobes" |
| 11/028,945 - Jan. 3, 2005 2005-0223543 - Oct. 13, 2005 7,640,651 - Jan. 5, 2010 | Cohen, et al., "A Fabrication Process for Co-Fabricating a Multilayer Probe Array and a Space Transformer" |
| 11/028,960 - Jan. 3, 2005 2005-0179458 - Aug. 18, 2005 7,265,565 - Sep. 4, 2007 | Chen, et al. "Cantilever Microprobes for Contacting Electronic Components and Methods for Making Such Probes |
| 11/029,180 - Jan. 3, 2005 2005-0184748 - Aug. 25, 2005 | Chen, et al. "Pin-Type Probes for Contacting Electronic Circuits and Methods for Making Such Probes" |
| 11/029,217 - Jan. 3, 2005 2005-0221644 - Oct. 6, 2005 7,412,767 - Aug. 19, 2008 | Kim, et al., "Microprobe Tips and Methods for Making" |
| 11/173,241 - Jun. 30, 2005 2006-0108678 - May 25, 2006 | Kumar, et al., Probe Arrays and Method for Making |
| 11/178,145 - Jul. 7, 2005 2006-0112550 - Jun. 1, 2006 7,273,812 - Sep. 25, 2007 | Kim, et al., "Microprobe Tips and Methods for Making" |
| 11/325,404 - Jan. 3, 2006 2006-0238209 - Oct. 26, 2006 | Chen, et al., "Electrochemically Fabricated Microprobes" |
| 14/986,500 - Dec. 31, 2015 2016-0231356 - Aug. 11, 2016 | Wu, et al. "Multi-Layer, Multi-Material Micro-Scale and Millimeter-Scale Devices with Enhanced Electrical and/or Mechanical Properties" |
| 16/172,354 - Oct. 18, 2018 2019-0204354 - Jul. 4, 2019 | Chen, et al. "Pin-Type Probes for Contacting Electronic Circuits and Methods for Making Such Probes" |
| 16/584,818 - Sep. 26, 2019 — — | Smalley, "Probes Having Improved Mechanical and/or Electrical Properties for Making Contact between Electronic Circuit Elements and Methods for Making" |

| U.S. patent application Ser. No., Filing Date U.S. application Pub No., Pub Date U.S. Pat. No., Pub Date | First Named Inventor, "Title" |
|---|---|
| 16/584,863 - Sep. 26, 2019 — — | Frodis, "Probes Having Improved Mechanical and/or Electrical Properties for Making Contact between Electronic Circuit Elements and Methods for Making" |
| 17/139,933 - Dec. 31, 2020 — — | Wu, "Compliant Pin Probes with Multiple Spring Segments and Compression Spring Deflection Stabilization Structures, Methods for Making, and Methods for Using" |
| 17/139,936 - Jan. 15, 2020 — | Wu, "Probes with Multiple Springs, Methods for Making, and Methods for Using" |
| 17/139,940 - Dec. 31, 2020 — | Wu, "Compliant Pin Probes with Flat Extension Springs, Methods for Making, and Methods for Using" |
| 16/791,288 - Feb. 14, 2020 — — | Frodis, "Multi-Beam Vertical Probes with Independent Arms Formed of a High Conductivity Metal for Enhancing Current Carrying Capacity and Methods for Making Such Probes" |
| 17/139,925 - Dec. 31, 2020 — — | Veeramani, "Probes with Planar Unbiased Spring Elements for Electronic Component Contact and Methods for Making Such Probes" |

Multi-Layer, Multi-Material Electrochemical Fabrication:

An electrochemical fabrication technique for forming three-dimensional structures from a plurality of adhered layers is being commercially pursued by Microfabrica® Inc. (formerly MEMGen Corporation) of Van Nuys, California under the process names EFAB™ and MICA FREEFORM®.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process, at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps. In other implementations (i.e. batch processes), multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer, or (3) a previously deposited material forming a portion of the given layer that is being created. The pressing together of the CC mask and relevant substrate, layer, or material occurs in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C.

The CC mask plating process is distinct from a "through-mask" plating process in that in a through-mask plating process, the separation of the masking material from the substrate would occur destructively. Furthermore, in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructures and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting, and patterning of the photoresist (i.e. voids formed in the photoresist) is formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases, after formation of the structure, the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example, it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

SUMMARY OF THE INVENTION

It is an object of some embodiments of the invention to provide an improved vertical probe which can meet size (e.g. length, cross-sectional, and array spacing requirements), force, overtravel, and/or current carrying requirements.

It is an object of some embodiments of the invention to provide an improved method for forming vertical probes which can meet size (e.g. length, cross-sectional, and array spacing requirements), force, overtravel, and/or current carrying requirements.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

In a first aspect of the invention, a vertical probe, includes: (a) a first end portion comprising a contact region; (b) a second end portion, different from the first end portion; and (c) a central portion extending longitudinally and connecting the first and second end portions, wherein the central portion comprises at least three compliant arms separated from one another by a at least one gap wherein the arms bend under load and extend longitudinally, wherein a cross-section taken perpendicular to a local longitudinal direction in the central portion encounters each of the at least three arms, wherein the at least three arms comprise at least first and second outer arms that bend elastically and at least one intermediate arm located at a position that is at least partially between the first and second outer arms, wherein each of the at least first and second outer arms comprise a material having a first yield strength while the at least one intermediate arm comprises a material having a second yield strength which is lower than the first yield strength.

Numerous variations of the first aspect of the invention are possible including, for example:

(1) the material having the second yield strength being a highly conductive material;
(2) the highly conductive material including a material selected from the group consisting of (a) copper, (b) gold, (c) silver, (d) an alloy of copper, (e) an alloy of gold, and (f) an alloy of silver;
(3) the material having the first yield strength including a material selected from the group consisting of: (a) nickel, (b) nickel-cobalt, (c) nickel-phosphor, (d) palladium, (e) beryllium-copper, (f) tungsten, (g) titanium, (h) nickel-tungsten, (i) palladium-rhenium, (j) an alloy of nickel, and (k) an alloy of palladium;
(4) the contact region including a first tip material different from the material with the first yield strength;
(5) a further variation of the $4^{th}$ variation wherein the first tip material includes a material selected from the group consisting of: (a) rhodium, (b) rhenium, (c) tungsten, and (d) tungsten carbide;
(6) the probe being formed from at least one layer of at least one material;
(7) the probe including a plurality of layers of material;
(8) a further variation of the $6^{th}$ or $7^{th}$ variation wherein each layer is a substantially planar layer and wherein each layer is defined by one or more materials located between an upper and lower boundary level of a longitudinal cross-section of the probe;
(9) a further variation of the $7^{th}$ or $8^{th}$ variation wherein each layer of the plurality of layers defines a different cross-section of the probe;
(10) a further variation of the $7^{th}$ variation, the $8^{th}$ variation as it depends from the $7^{th}$ variation, or the $9^{th}$ variation wherein the plurality of layers include a number of layers selected from the group consisting of: (a) two layers, (b) three layers, (c) four layers, (d) five layers, and (e) greater than five layers;
(11) a further variation of the $6^{th}$ to $10^{th}$ variations where a bending plane for the probe, when in use, is a plane parallel to the plane of the at least one layer;
(12) the at least one intermediate arm including a plurality of intermediate arms;

(13) the outer arms of the probe being substantially linear prior to mounting or loading the probe into an array configuration;
(14) at least two of the plurality of outer arms having a parallel configuration;
(15) the outer arms being curved prior to mounting them to a substrate;
(16) the outer arms being curved prior to loading them into array guide plates;
(17) the outer arms being curved upon setting the relative XY positions of a plurality of guide plates that hold the probe as part of an array;
(18) the outer arms of the probe being curved upon formation;
(19) the probe being further curved upon setting the relative XY positions of a plurality of guide plates that hold the probe as part of an array;
(20) at least two of the plurality of outer arms longitudinally following a locally parallel configuration, relative to each other, over at least a portion of a length of the at least two arms;
(21) the at least two outer arms having an average radius of curvature along their longitudinal lengths that is larger than an average radius of curvature along a longitudinal length of the at least one intermediate arm;
(22) a configuration and positioning of the intermediate arm providing all portions of the intermediate arm, over the entire range of motion of the probe while in use, to a limited stress level on the material having the second yield strength that is selected from the group consisting of: (a) less than an ultimate strength of the material having the second yield strength; (b) less than the yield strength of the material having the second yield strength; (c) less than 80% of the yield strength of the material having the second yield strength, (d) less than 65% of the yield strength of the material having the second yield strength, and (e) less than 50% of the yield strength of the material having the second yield strength;
(23) the second yield strength being selected from the group consisting of: (a) less than one-half the first yield strength, (b) less than one-third the first yield strength, and (c) less than one quarter the first yield strength;
(24) the at least one intermediate arm consisting of a material selected from the group consisting of: (a) a single metal and (b) a single alloy;
(25) the probe having a cross-section having both a width and thickness substantially perpendicular to a local longitudinal axis of the probe in the central portion, wherein the thickness is parallel to a layer normal and the width is perpendicular to the layer normal (i.e. within the plane of a layer) and wherein a ratio of width to thickness is selected from the group consisting of: (a)⇐0.25, (b)⇐0.40, (c)⇐0.60, (d)⇐0.80, (e)⇐1, (f)⇐1.25, (g)⇐1.7, (h)⇐2.5; and (j)⇐4.0;
(26) a further variation of the $25^{th}$ variation wherein the width of the probe in the central portion is selected from the group consisting of: (a)⇐150 um (microns or micrometers), (b)⇐120 um, (c)⇐100 um, (d)⇐80 um, (e)⇐60 um, and (f)⇐40 um, and wherein the thickness of the probe in the central portion is selected from the group consisting of: (a)⇐150 um, (b)⇐120 um, (c)⇐100 um, (d)⇐80 um, (e)⇐60 um, and (f)⇐40 um; and
(27) the probe having a first bending moment and a second bending moment for a force parallel to that bending moment at a distance R therefrom, wherein the first bending moment is in a plane perpendicular to a layer normal and perpendicular to a local longitudinal axis of the probe and the second bending moment is parallel to a layer normal and perpendicular to a local longitudinal axis of the probe, and wherein a ratio of the first and second bending moments is selected from the group consisting of: (a)⇐0.25, (b)⇐0.40, (c)⇐0.60, (d)⇐0.80, (e)⇐1, (f)⇐1.25, (g)⇐1.7, (h)⇐2.5; and (j)⇐4.0.

In a second aspect of the invention, a multi-layer, multi-material electrochemical fabrication process for the batch fabrication of probes according to the first aspect of the invention includes: (A) forming a plurality of probes from a plurality of adhered layers on a substrate, with each successive layer including at least two materials, one of which is a structural material and the other of which is a sacrificial material, and wherein each successive layer defines a successive cross-section of the plurality of probes, and wherein the forming of each of the plurality of successive layers includes: (i) depositing a first of the at least two materials; and (ii) depositing a second of the at least two materials; and (B) after the forming of the plurality of successive layers, separating at least a portion of the sacrificial material from the structural material to reveal the plurality of probes, wherein the probes include the features set forth in the first aspect of the invention or the features found in a combination of the first aspect with the one or more variations of the first aspect.

In a third aspect of the invention, a two-dimensional probe array, having a similar probe pitch spacing in both dimensions, for testing a DUT, includes: (a) at least one array structure having a plurality of openings; (b) a plurality of vertical probes with each inserted into an opening in the at least one array structure, wherein each vertical probe comprises: (i) a first end portion comprising a contact region; (ii) a second end portion, different from the first end portion, (iii) a central portion extending longitudinally and connecting the first and second end portions, wherein the central portion comprises at least three compliant arms separated from one another by at least one gap wherein the arms bend under load and run longitudinally, wherein a cross-section taken perpendicular to a local longitudinal direction in the central portion encounters each of the at least three arms, wherein the at least three arms comprise at least first and second outer arms that bend elastically and at least one intermediate arm located at a position that is at least partially between the first and second outer arms, wherein each of the at least first and second outer arms comprise a material having a first yield strength while the at least one intermediate arm comprises a material having a second yield strength which is lower than the first yield strength, and wherein the at least one array structure and the probes are configured to provide probe tips in a two-dimensional array where a nominal pitch for tip-to-tip spacing in a first dimension, perpendicular to a second dimension, is between ⅕ and 5 times a nominal tip-to-tip pitch in the second dimension.

Numerous variations of the third aspect of the invention are possible and include for example: (1) the nominal pitch for tip-to-tip spacing in a first dimension, perpendicular to a second dimension, is between ⅓ and 3 times a nominal tip-to-tip pitch in the second dimension; (2) the nominal pitch for tip-to-tip spacing in a first dimension, perpendicular to a second dimension, is between ½ and 2 times a nominal tip-to-tip pitch in the second dimension; (3) the array structure includes two array structures both with a plurality of openings and with the two structures forming at least part of an assembly for holding the probes such that each of a plurality of probes extends through each of the two array structures; (4) any of the variations noted above for the first aspect; and (5) any other alternatives set forth in the embodiments as described herein, or as incorporated herein by reference, so long as the combination is functional.

Other aspects of the invention will be understood by those of skill in the art upon review of the teachings herein. Other aspects of the invention may involve combinations of the above noted aspects of the invention as well as functional combinations of the variations of those aspects with each other and with other aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 6A-6B3 provide a top view of an example probe as a whole (FIG. 6A) and a view of each of three stacked individual layers (FIG. 6B1, Layer 1; FIG. 6B2, Layer 2; and FIG. 6B3-layer 3) forming the probe that in some respects is similar to that of the probe of FIG. 5A but is also different in a number of ways.

FIGS. 7A-7B3 provide a top view of another example probe as a whole (FIG. 7A) and a view of each of three individual layers (FIG. 7B1, Layer 1; FIG. 7B2, Layer 2; and FIG. 7B3-layer 3) forming the probe that in some respects is similar to that of the probe of FIGS. 5A and 6A but is also different in a number of ways.

DETAILED DESCRIPTION OF PREFERRED EMBODIMENTS

Electrochemical Fabrication in General

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
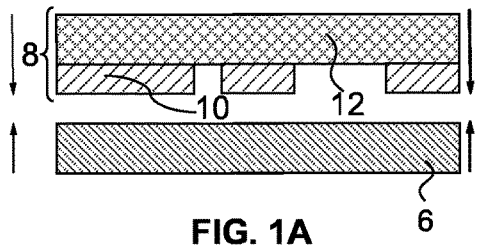
FIGS. 1A-1C schematically depict side views of various stages of a CC mask plating process, while FIGS. 1D-1G schematically depict side views of various stages of a CC mask plating process using a different type of CC mask.
Figure 1B:
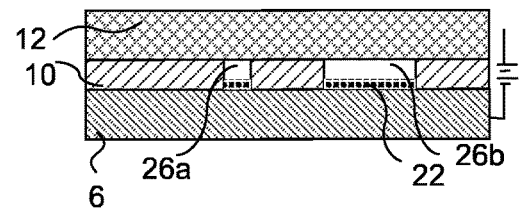
Figure 1C:
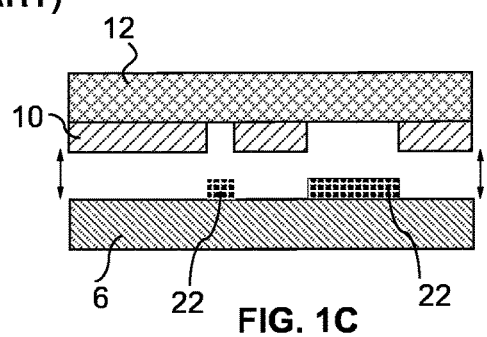
Figure 1D:
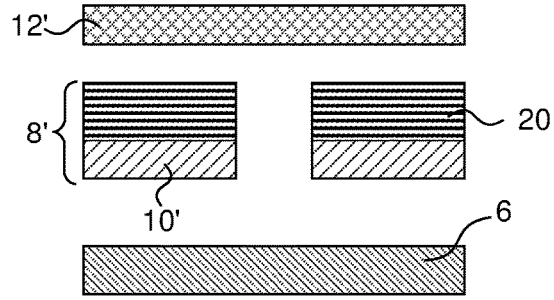
Figure 1E:
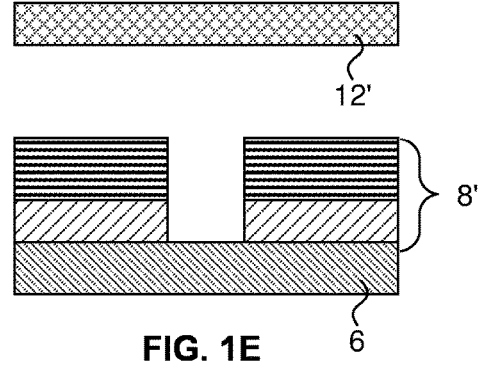
Figure 1F:
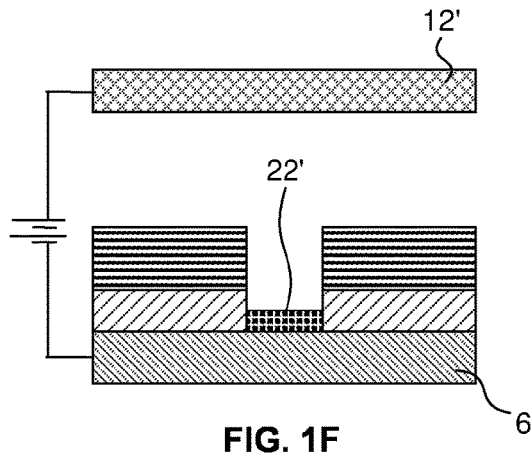
Figure 1G:
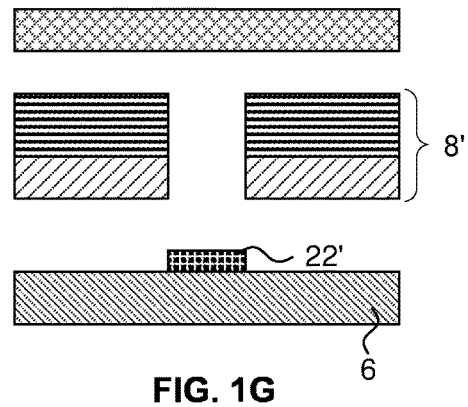
Figure 2A:
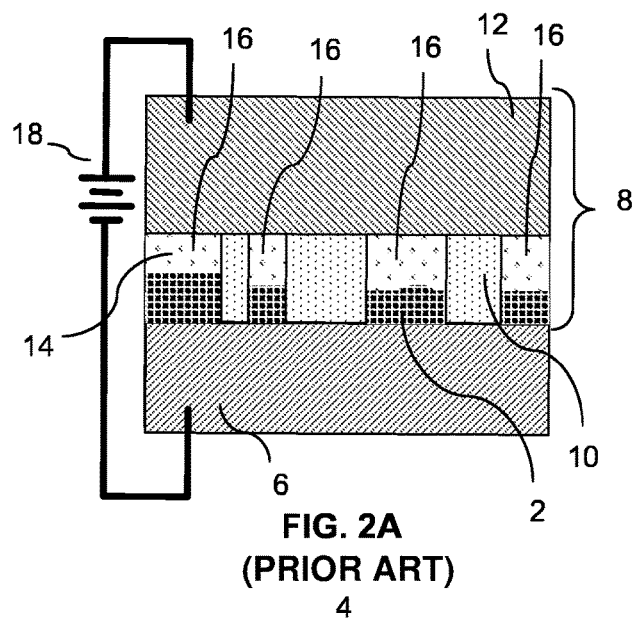
FIGS. 2A-2F schematically depict side views of various stages of an electrochemical fabrication process as applied to the formation of a particular structure where a sacrificial material is selectively deposited while a structural material is blanket deposited.
Figure 2B:
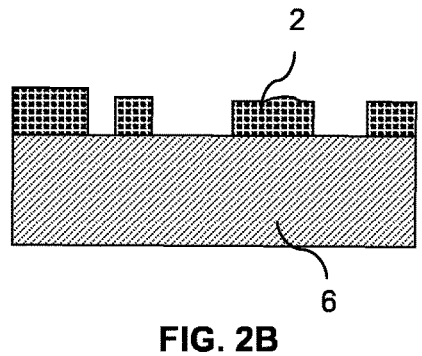
Figure 2C:
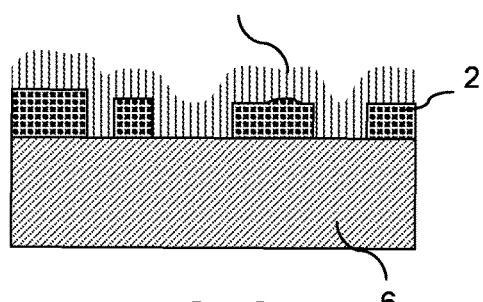
Figure 2D:
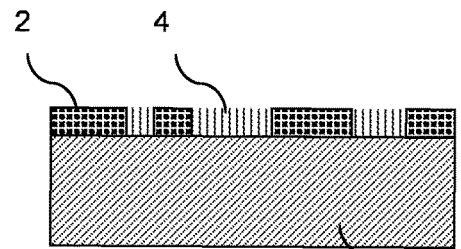
Figure 2E:
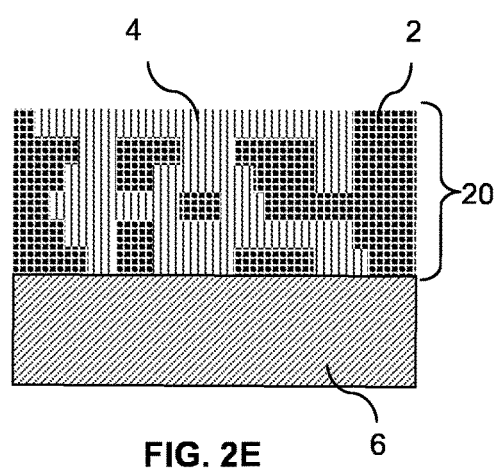
Figure 2F:
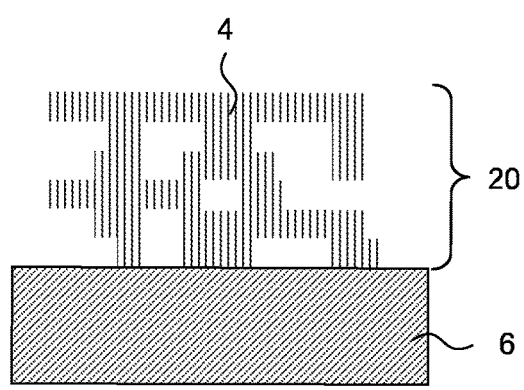
Figure 3A:
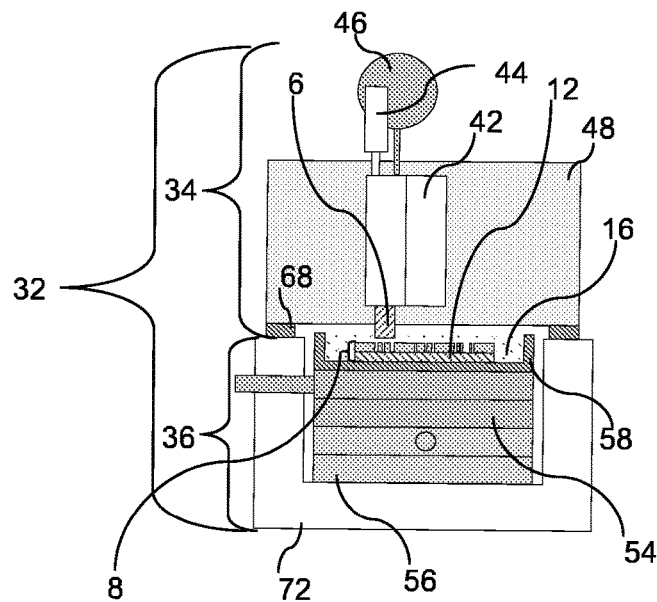
FIGS. 3A-3C schematically depict side views of various example subassemblies that may be used in manually implementing the electrochemical fabrication method depicted in FIGS. 2A-2F.
Figure 3B:
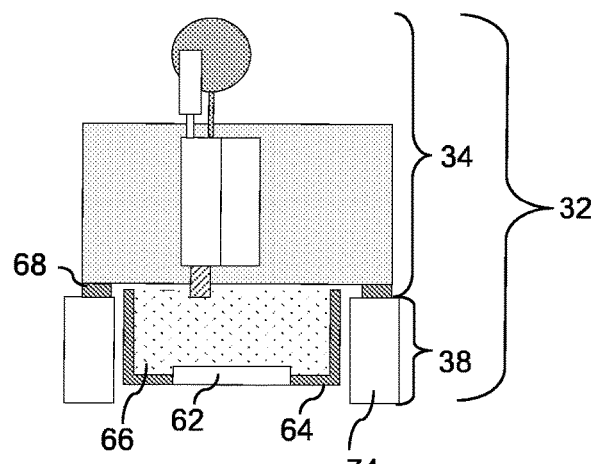
Figure 3C:
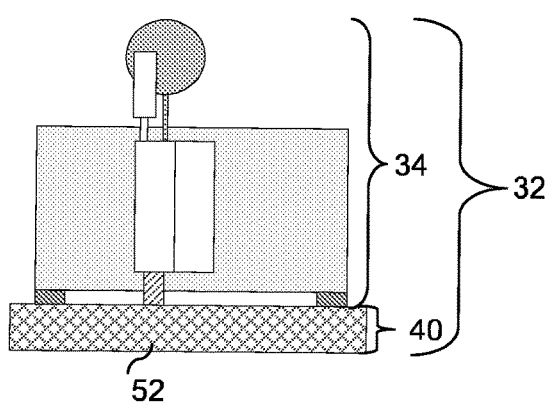
Figure 4A:
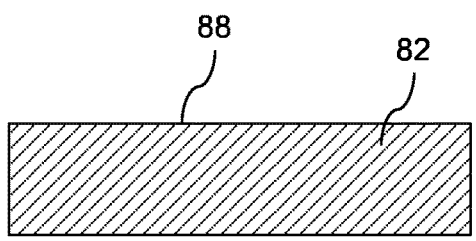
FIGS. 4A-4F schematically depict the formation of a first layer of a structure using adhered mask plating where the blanket deposition of a second material overlays both the openings between deposition locations of a first material and the first material itself.
Figure 4B:
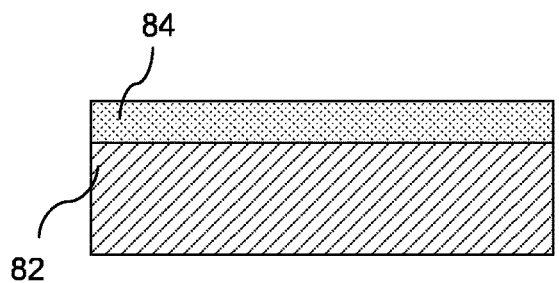
Figure 4C:
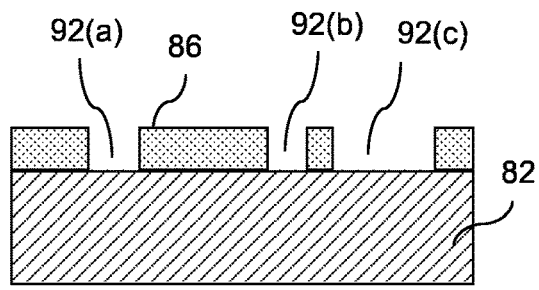
Figure 4D:
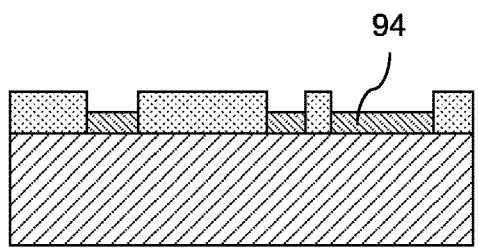
Figure 4E:
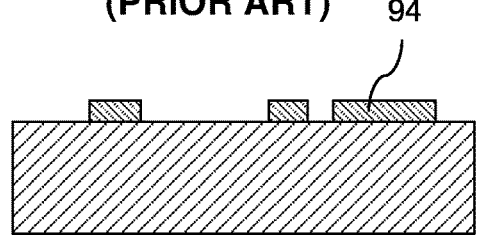
Figure 4F:
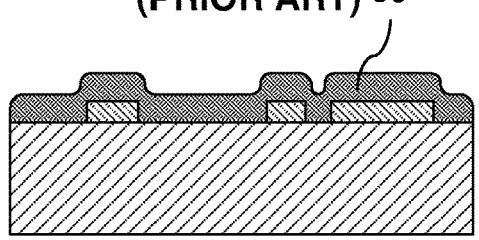
Figure 4G:
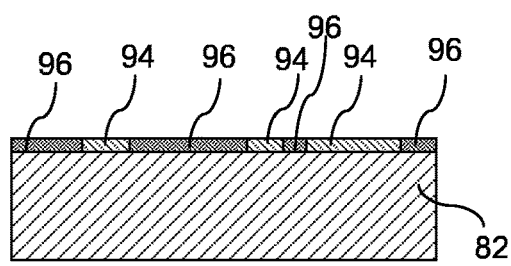
FIG. 4G depicts the completion of formation of the first layer resulting from planarizing the deposited materials to a desired level.
Figure 4H:
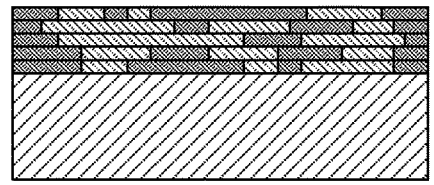
FIGS. 4H and 4I respectively depict the state of the process after formation of the multiple layers of the structure and after release of the structure from the sacrificial material.
Figure 4I:
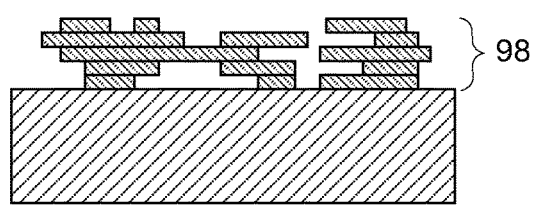

FIGS. 4A-4I illustrate side views of various states in an alternative multi-layer, multi-material electrochemical fabrication process. FIGS. 4A-4G illustrate various stages in the formation of a single layer of a multi layer fabrication process where a second metal is deposited on a first metal as well as in openings in the first metal so that the first and second metal form part of the layer. In FIG. 4A, a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H, the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some, or all, of which may be electrodeposited (as illustrated in FIGS. 1A-4I) or electroless deposited. Some of these structures may be formed from a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments, structures having features positioned with micron level precision and minimum feature size on the order of tens of microns are to be formed. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions extending into the 0.5-20 millimeter range, or somewhat larger and with features positioned with precision in the 0.1-10 micron range and with minimum features sizes on the order of 1-100 microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration) . Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes, the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view, they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example, by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession of one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having a thickness less than 2 microns, 1 micron, 0.5 microns, or even 0.2 microns. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general, sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases, the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures where the structural material portion of at least one layer includes a region not bounded by the structural material of the other layer.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures" are complex multilayer 3D structures for which the alternating of void and structure or structure and void not only exists along one of a vertically or horizontally extending line but along lines extending both vertically and horizontally.

"Highly complex multilayer (or 3D or 3-D) structures" are complex multilayer 3D structures for which the structure-to-void-to-structure or void-to-structure-to-void alternating occurs once along the line but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience, the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely, a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances, the yield requirement per feature may be as high as 90%, 95%, 99%, or even higher. In some circumstances (e.g. in producing a filter element), the failure to produce a certain number of desired features (e.g. a 20-40% failure) may be acceptable while in an electrostatic actuator the failure to produce a single small space between two moveable electrodes may result in failure of the entire device. The MFS, for example, may be defined as the minimum width of a narrow and processing element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

Probes:

Embodiments are directed to vertical probes or pin probes. These probes may be formed with their longitudinal axes (i.e. tip-to-tip axes, tip-to-tip heights, base-to-tip axes, or base-to-tip heights) oriented perpendicular to a layer stacking axis or layer surface normal when being formed from a single layer or from the buildup of a plurality of layers (i.e. with their longitudinal axes being oriented parallel to the lateral extents of a layer or layers from which the probe is formed). Alternatively, the longitudinal axes of the probes may be formed parallel to a stacking axis of the layers or at some other angle between parallel and perpendicular to the stacking axis of the layers. Unlike cantilever probes, vertical probes typically have longitudinal extents (e.g. heights in Z) that are much greater than their lateral extends (e.g. widths in X and Y). For example, the ratio of height to maximum width for vertical probes may be in range from 5/1 or 10/1 to 100/1 or more. Unlike cantilever probes, vertical probes can be arranged into two-dimensional arrays with close packing, or pitch, in both X and Y directions simultaneously. As used herein, nominal pitch or minimum pitch is the closest, used or useable, tip-to-tip spacing of two adjacent similar probes that are similarly oriented. A packing ratio, PR (minimum or nominal pitch) of acceptable tip-to-tip spacing of adjacent vertical probes in X (to acceptable tip-to-tip vertical probe spacing in Y may be within ⅕ and 5, i.e. ⅕⇐PR⇐5, and is often within ½ to 2, and in practice is believed to often be within a 0.9 to 1.1 packing ratio). In many vertical probe arrays, the tip-to-tip spacing between probes in X is less than 5 times the width of the probe in X, i.e. the spacing/width ratio is less than about five, and similarly the spacing between probes in Y is less than about 5 times the width of the probe in Y. The spacing to width ratio in both X and Y is often less than 3 and is often about 2 or less.

Vertical probes of some embodiments of the invention may be formed of at least one layer that longitudinally includes a first end, second end, and a central portion, with the central portion including at least three compliant arms, or beams, that extend in parallel, wherein each of the two outer arms include a material having a first yield strength greater than a first amount and the at least one intermediate arm (or beam) formed of a material having a second yield strength less than the first yield strength wherein second yield strength of the material of the intermediate arm has a ratio to that of an outer arm of less than 1, more preferably less than 0.8, even more preferably less than 0.6, and most preferably less than 0.4. The intermediate arm also most preferably has an average radius of curvature along its length that is less than an average radius of curvature of each of the outer arms along their lengths. The at least one intermediate arm is most preferably formed of a highly conductive material (e.g. a material having an electrical conductivity greater than $30 \times 10^6$ siemens/meter, more preferably greater than $40 \times 10^6$ siemens/meter, such as gold, copper or silver) while the outer arms provide the vast majority of an elastic spring force of the probe during normal operation of the probe. In some embodiments, the outer arms, for example, may be formed of nickel, nickel-cobalt, nickel-phosphor, palladium, beryllium-copper, tungsten, titanium, nickel-tungsten, palladium-rhenium, an alloy of nickel, or an alloy of palladium. A bending moment, or tendency to bend, of the probe is preferentially, though not necessarily, in a direction parallel to a plane of the at least one layer forming the probe. Though formation of a probe from a single layer is possible, probes of many embodiments are preferentially formed from a plurality of adhered layers, and the adhered layers are preferentially formed using a multi-material, multi-layer electrochemical fabrication process. In some embodiments, the probes are formed in a batch process that produces a plurality of probes simultaneously.

Figures 5A, 5B:
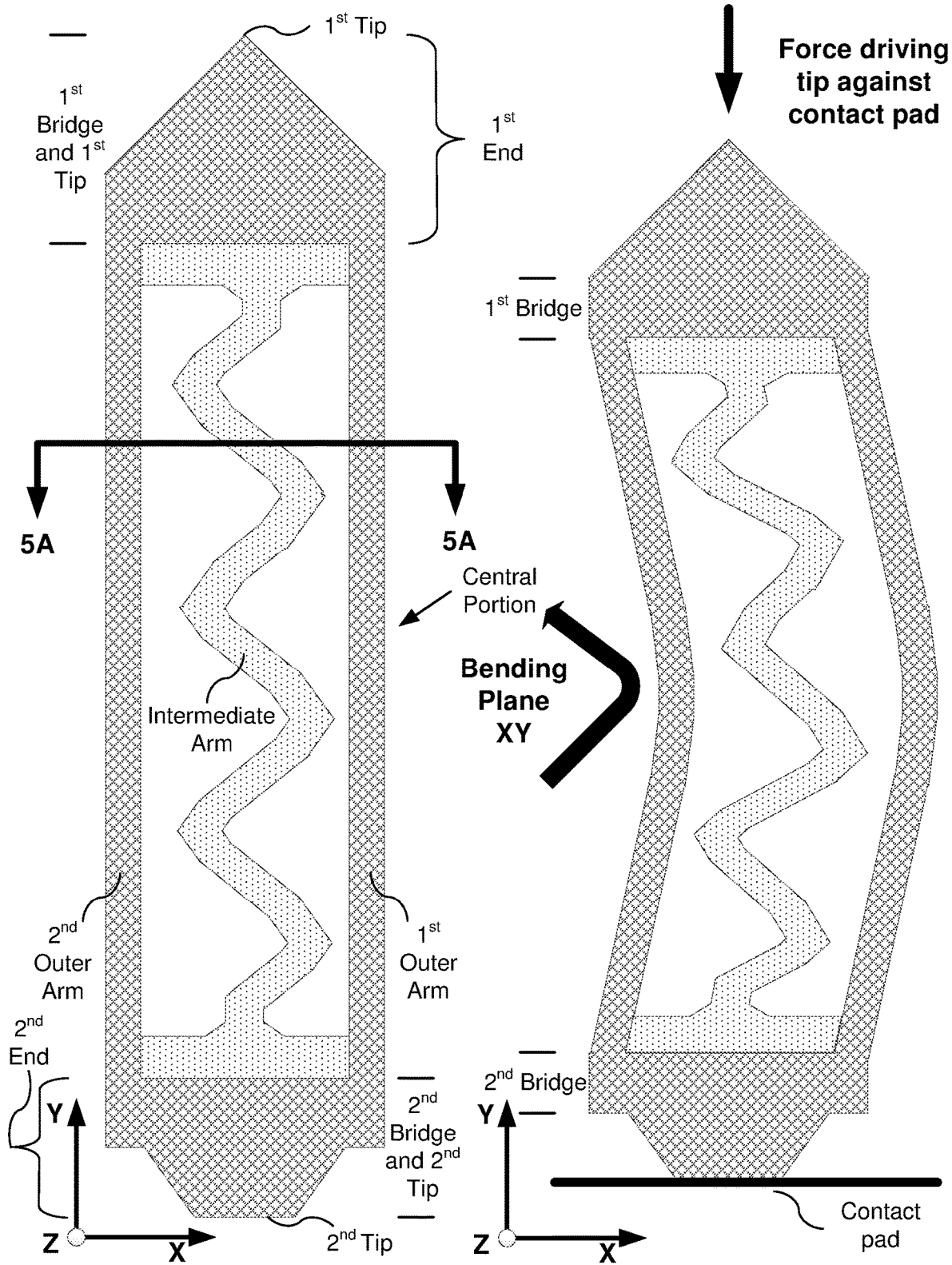
FIG. 5A provides a side view of an example probe according to a first embodiment of the invention wherein a longitudinal axis of the probe extends in the Y-direction, a width of the probe extends in the X-direction, and thickness of the probe extends in the Z-direction, which include the thickness of one or more layers, and where the probe is made of two materials wherein a high yield strength material having a larger radius of curvature is used for the outer arms and the probe ends while a second, lower yield strength, and higher conductivity material having a lower average radius of curvature is used for the intermediate arm.
FIG. 5B provides a view of the probe of FIG. 5A but where a compressive force has been applied between the two ends of the probe and the probe in turn has undergone compression by elastically bending under the induced stress wherein the probe is configured to preferentially bend within the plane of the sheet of paper as opposed to out of the sheet of paper wherein the highest stresses are applied to the outer arms while the configuration and material of the intermediate arm provides for easier and low stress deflection.

FIG. 5A provides a top view of a probe from a direction parallel to a layer normal (i.e. a side view of a probe with its longitudinal axis formed parallel to lateral extents of the layer) of an example probe according to a first embodiment of the invention wherein a longitudinal axis of the probe extends in the Y-direction, a width of the probe extends in the X-direction, and thickness of the probe extends in the Z-direction, which may provide for the thickness of one or more layers, where an intermediate portion of the probe is formed from three independent arms including two outer arms on either side of an intermediate arm (e.g. arms separated from one another by a spacing or gap (e.g. an air gap, a gap occupied by an inert gas, or a vacuum)), and where the probe is made of two materials wherein a high yield strength material having a larger radius of curvature that is used for the outer arms and the probe ends while a second, lower yield strength, and higher conductivity material having a lower average radius of curvature is used for the intermediate arm. In usage, or in assembly of a plurality of probes into a probe card or other array structure, the probe axes may be relabeled such that the longitudinal axis of the probe becomes the Z-axis. In terms of build orientation, the thickness of the probe in Z may be less than or greater than its width in X. Due to the configuration of the probe (e.g. the width of individual arms, the thickness of individual arms versus their thickness, the spacing between individual arms, preferential bending configuration designed into the arms, or preloading or bending applied to the probe when loading into an array configuration) the probe can be made to have a preferential bending plane and associated bending moment that is parallel to the planes of the layers, perpendicular to the planes of the layers, or somewhere in-between.

FIG. 5B provides a view of the probe of FIG. 5A but where a compressive force has been applied between the two ends of the probe (e.g. by pressing one end of the probe against a contact pad or bump of a device under test (DUT) and a contact pad or bump of another circuit element associated with passing signals on to a tester (e.g. a PCB or a space transformer) and the probe in turn has compressed by elastically bending (in a bending plane or path) under the induced stress wherein the probe is configured to preferentially bend within the plane of the sheet of paper as opposed to out of the plane of the paper wherein the highest stresses are applied to the outer arms while the configuration and material of the intermediate arm provide for easier and low stress deflection. In other embodiments, bending may be in planes with other orientations and/or bending may result in longitudinal twisting of the probe as it compresses.

FIGS. 5C-5G provide various cross-sectional cut views along the line of 5A-5A of FIG. 5A illustrating various examples of the probe of the example of FIG. 5A may be formed of a single layer, formed of a plurality of layers where the formation of arm elements may exist on some layers and not on other layers such that different thicknesses and numbers of outer arms may exist as well as different thickness and numbers of intermediate arms may also exist.

Figure 5C:
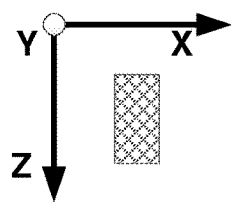
FIGS. 5C-5G provide various alternative cross-sectional cut views along the line of 5A-5A of FIG. 5A showing that probes of the example of FIG. 5A may be formed using a single layer (FIG. 5C) or using a plurality of layers (FIGS. 5D-5G) wherein the formation of arm elements may exist on some layers and not on other layers such that different thicknesses and numbers of outer arms may exist as well as different thickness and numbers of intermediate arms may also exist.
Figure 5C:

FIG. 5C provides an example cut end view of the probe of FIG. 5A from viewing direction 5A-5A as seen in FIG. 5A wherein the probe is shown, in this example, as being formed from a single layer of two materials with the outer arms formed of a different material from that of the inner arm.

Figure 5D:
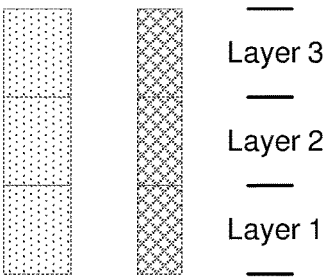

FIG. 5D provides an example cut end view of the probe of FIG. 5A from viewing direction 5A-5A as seen in FIG. 5A wherein the probe is shown, in this example, as being formed from three layers with the formation along the cut line showing that all three layers are formed with identical configurations at least along the cross-sectional view provided by the cut line.

Figure 5E:
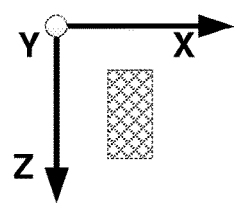
Figure 5E:
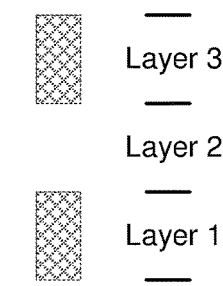

FIG. 5E provides an example cut end view of the probe of FIG. 5A similar to that of FIG. 5D with the exception that there are no outer arm portions formed as part of the second layer leading to the result that there are four outer arms with a thickness of one layer each and one intermediate arm with a thickness of three layers.

Figure 5F:
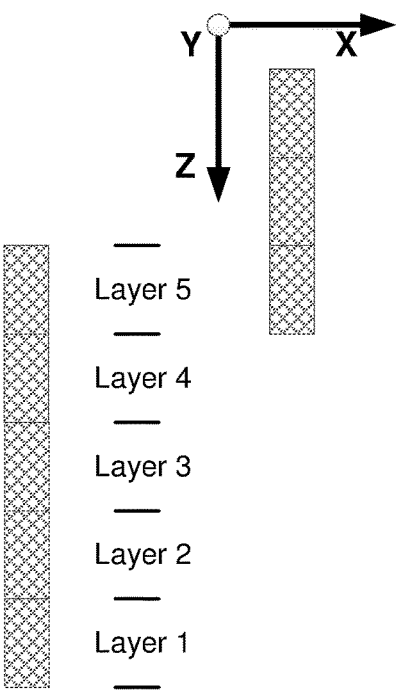

FIG. 5F provides an example cut end view of the probe of FIG. 5A similar to that of FIG. 5D with the exception that there are no intermediate arm portions formed with a second layer such that in effect two outer arms are formed with a thickness of three layers each and two intermediate arms are formed with a thickness of one layer each and spaced apart from one another by one layer.

Figure 5G:
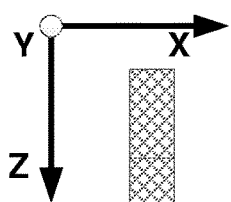

FIG. 5G provides an example cut end view of the probe of FIG. 5A from viewing direction 5A-5A as seen in FIG. 5A wherein the probe is shown, in this example, as being formed from five layers with the formation along the cut line showing all five layers are formed with identical configurations at least along the cross-sectional view provided by the cut line.

Numerous other variations of the probe of FIGS. 5A-5G are possible and include, for example: (1) probes with different probe tip configurations on one or both ends, (2) probes having tip or contact materials different from elastic outer arm material and different intermediate arm material, (3) probes with different numbers of outer arms and intermediate arms than set forth in the specific examples illustrated, (4) probes with different lengths, (5) probes with different widths, (6) probes with different thicknesses, (7) probes with different arm widths and/or thicknesses at different positions along their lengths, (8) probes with outer arms that do not extend straight from one end to the other end but have designed curvature or curves at various locations along their lengths (e.g. bowed or serpentine configurations), (9) probes with individual outer arms that are located in one or more different layers along their lengths (e.g. exist on one or more layers on one end and one or more different layers on the other end, or exist on one or more layers on both ends and exist on one or more different layers in an intermediate region, e.g. providing arms with spiraling configurations), (10) probes where the intermediate arm or arms are made from a single material where that material is different from any material of one of the outer arms, (11) probes where one or more of the outer arms are made from more than one material wherein each of the more than one material is different from a material forming at least one intermediate arm wherein the at least one different material has a yield strength that is higher, and/or conductivity that is lower than, a corresponding property of the material of the at least one intermediate arm; (12) probes wherein at least one intermediate arm is made from more than one material wherein each of the more than one material is different from a material forming at least one outer arm and the at least one different material has a yield strength that is lower, and/or conductivity that is higher, than a corresponding property of the material of the at least one outer arm; (13) probes where at least one intermediate arm and at least one outer arm include the same material but where one of such arms includes a different material wherein the different material, if on an outer arm, has a higher yield strength and/or lower conductivity than a material or materials of the intermediate arm, or if on an intermediate arm, the different material has a lower yield strength and/or a higher conductivity than a material or materials of the outer arm, (14) the gaps between at least one intermediate arm and at least two outer arms extend unbroken for a portion of an overall probe length selected from the group consisting of: (a) greater than 30%, (b) greater than 50%, (c) greater than of 70%, (d) greater than 80%, and (e) greater than 90%, (15) the gap between at least one intermediate arm and the at least two outer arms comprises a number of gaps selected from the group consisting of: (a) no more than four, (b) no more than three, (c) no more than two, and where the length of the summed gaps between each of the at least two outer arms and the at least one intermediate arm is an amount selected from the group consisting of: (a) greater than 30%, (b) greater than 50%, (c) greater than 70%, (d) greater than 80%, and (e) greater than 90%, (16) at least one gap extends a length of the intermediate arm without break; (17) a plurality of gaps extend the length of the intermediate arm without break; (18) all gaps extend a length of the intermediate arm without break; (19) at least one gap extends a length of an outer arm without break; (20) a plurality of gaps extend the length of their adjacent outer arm without break; and (21) all gaps extend a length of at least one outer arm without break. Other variations are possible and will be apparent to those skill in the art upon reviewing the teachings herein.

FIGS. 6A-6B3 provide a longitudinal view of an example probe (FIG. 6A) and views of each of three individual layers (FIGS. 6B1 to 6B3) that make up the probe. The probe is different in some way from that of FIG. 5A. The probe is formed from three layers as can be seen in the first, second, and third layer views of FIGS. 6B1, 6B2, and 6B3. The first tip is formed with a first tip material that may be different from the material of the outer arms as can be seen in FIGS. 6A and 6B2. The second tip is formed with a second tip material that may be different from the first tip material and also different from the material of the outer arms as can be seen in FIGS. 6A and 6B2. The first tip extends beyond the materials of the first and third layers and extends between the material bridging the outer arm material of the first and third layers as can be seen by comparing FIG. 6B2 to both of FIGS. 6B1 and 6B3. The second tip extends beyond the materials of the first and third layers and extends between and interlocks with the material bridging the outer arm material of the first and third layers (i.e. has reentrant features with respect to the bridging outer arm material) as can be seen by comparing FIG. 6B2 to both of FIGS. 6B1 and 6B3. In some variations, for example, probe tip or contact materials may include rhodium, rhenium, tungsten, tungsten carbide, or other hard and wear resistant materials.

FIGS. 7A-7B3 provide a longitudinal view of another example probe and views of each of three individual layers that make up the probe. The probe is different from that of FIG. 5A in a number of ways. The probe is formed from three layers as can be seen in the first, second, and third layer views of FIGS. 7B1, 7B2, and 7B3. The first tip is formed with a first tip material that may be different from the material of the outer arms as can be seen in FIGS. 7A and 7B2. The second tip is formed with a second tip material that may be different from the first tip material and also different from the material of the outer arms as can be seen in FIGS. 7A and 7B2. The material of the intermediate arm and of the first and second tips bridges the outer layer material on first and third layers. The intermediate arm material and a material of the outer arms connect the outer arms to one another in the first and second end regions. The intermediate arm material on the second layer is interlocked between the first and third layers by the intermediate arm material of the first and third layers extending over the bridging outer arm material of the second layer as can be seen by comparing FIG. 7B2 to both of FIGS. 7B1 and 7B3.

FIGS. 8A-8G provide various longitudinal views (i.e. showing a top view of the probe along a layer stacking direction) of various additional sample probes showing additional example variations that may be included in various embodiments of the invention.

Figure 8A:
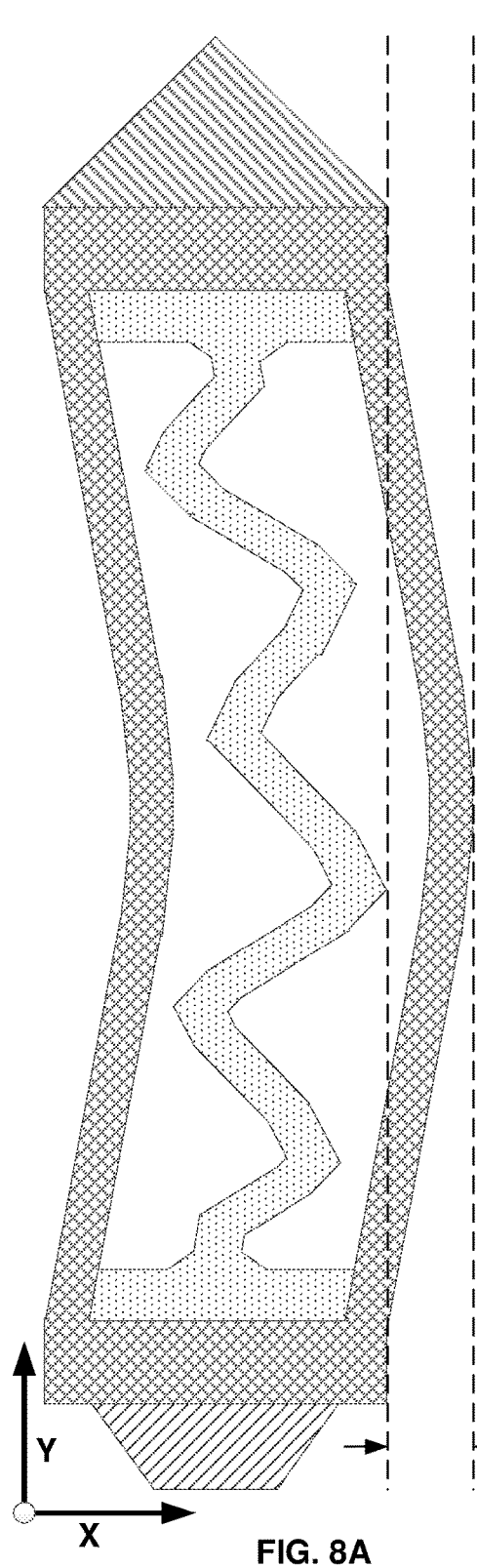
FIGS. 8A-8G provide various views of layers of additional sample probes showing additional example variations that may be included in various embodiments of the invention.

FIG. 8A illustrates an example probe where both outer arms are formed with curved configurations that provide a preferential bending direction when the probe is compressed longitudinally where the first and second probe ends remain vertically aligned.

Figure 8B:
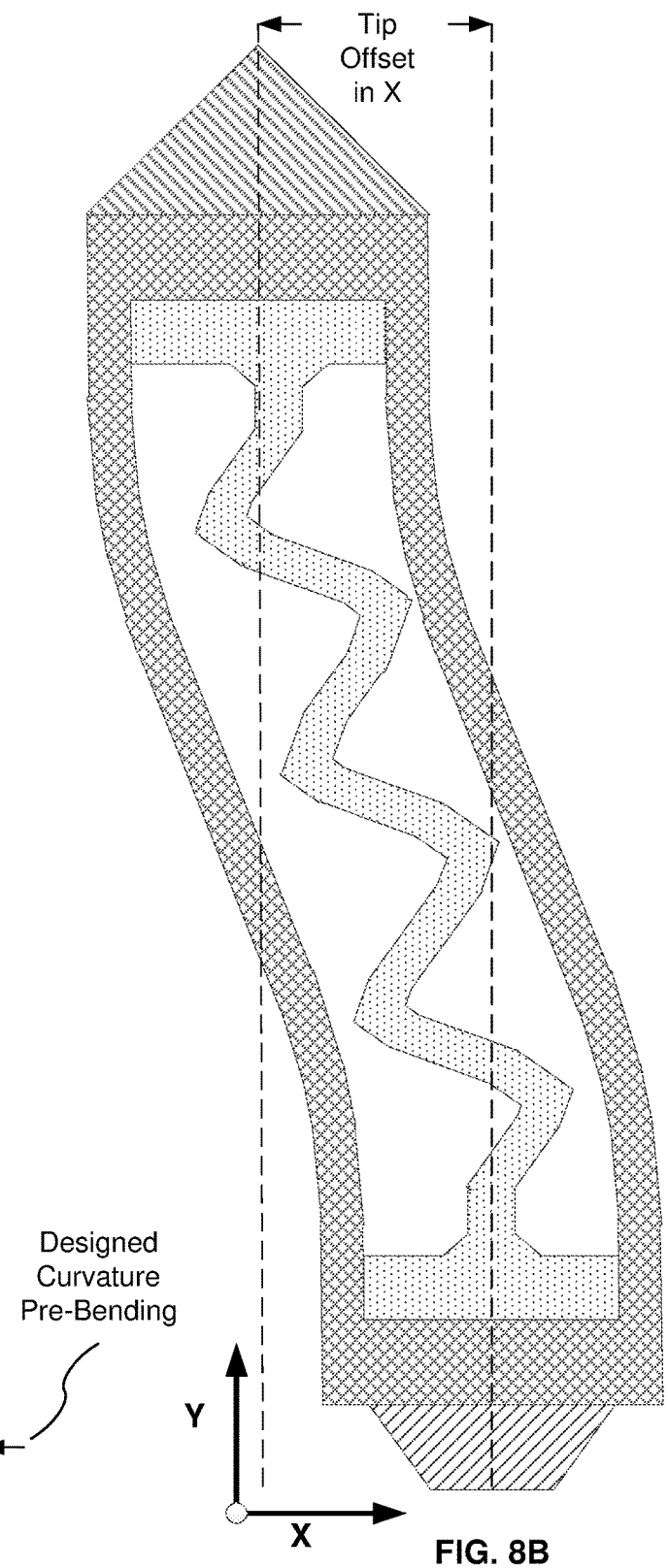

FIG. 8B illustrates an example probe where both outer arms are formed with curved configurations that provide a preferential bending direction when the probe is compressed longitudinally where the first and second probe ends are offset in X from one another upon formation.

Figure 8C:
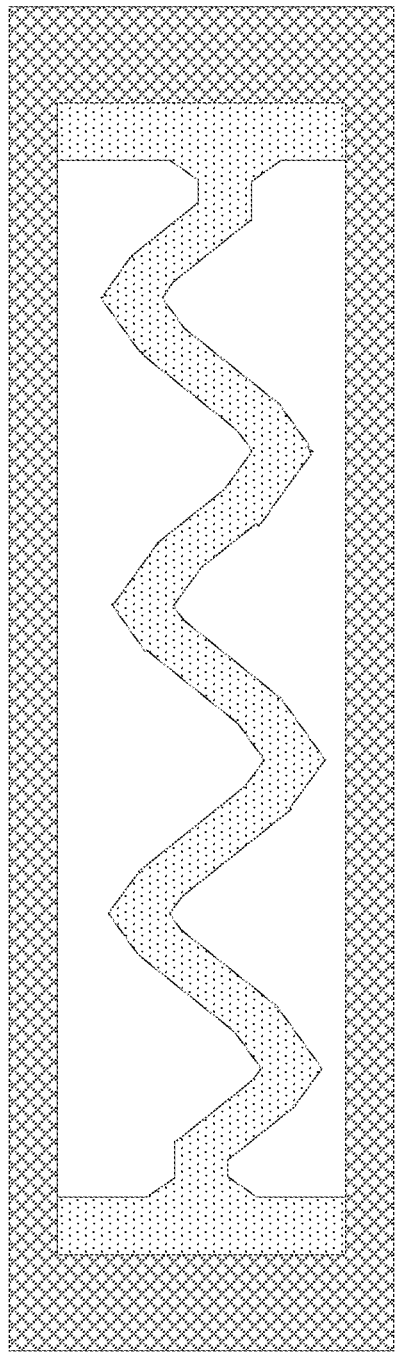

FIG. 8C illustrates an example probe where tips extending beyond the outer arm material are removed in favor of the tips that correspond to the ends of outer arm bridging material wherein a different material may be used in forming end regions associated with any intermediate or hidden outer layer.

Figure 8D:
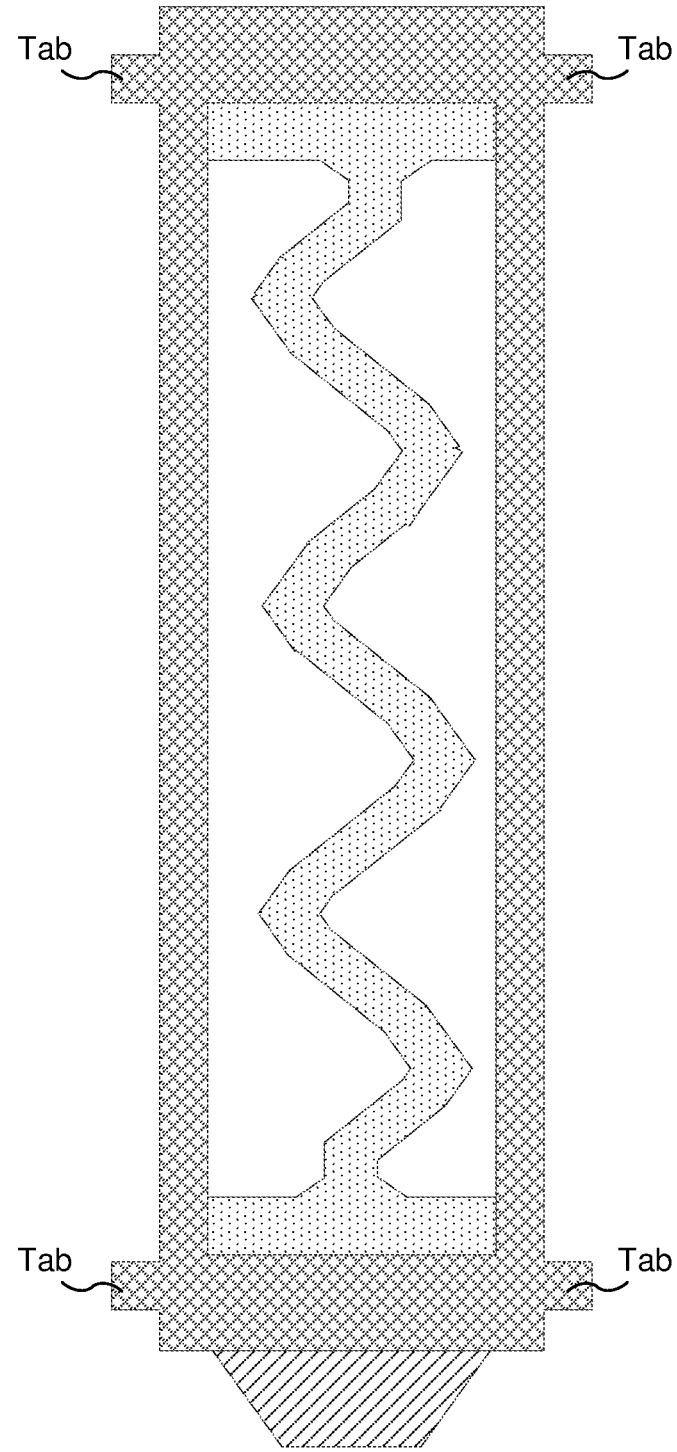

FIG. 8D illustrates an example probe where two primary differences from the probe of FIG. 5A exist: (1) the second tip region extends beyond the outer arm material while any extension beyond the outer arm material for the first tip region is non-existent in favor of a tip or contact that corresponds to the end of the outer arm material, and (2) the probe includes four sample tabs that extend beyond the outer arms (i.e. two on either side) which may be used as stops or alignment features when loading probes into one or more array guide plates or other structures, e.g. a substrate with alignment openings. In different embodiments, fewer tabs may be used, different numbers of tabs may be used, tabs may take on different shapes, tabs may be located in different longitudinal positions on the left and right sides (or front and back—not shown) to promote, for example, a preferred bending direction when engaging one or more array structures tabs may be located in different locations, and the like.

Figure 8E:
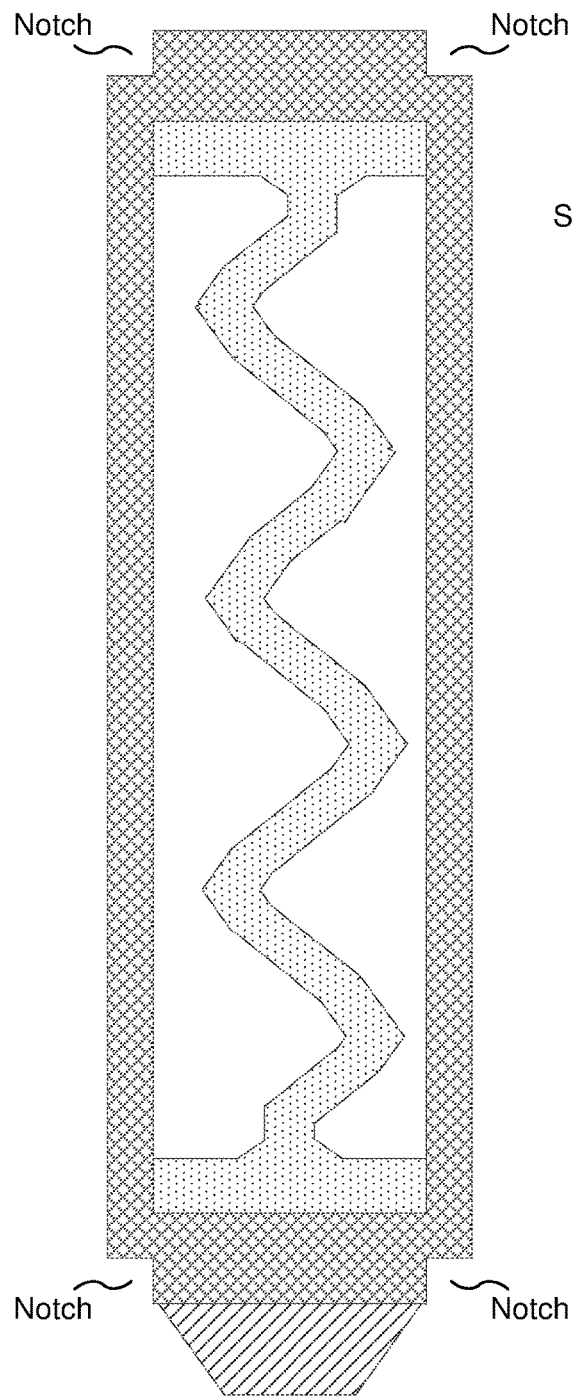

FIG. 8E provides an example probe similar to that of FIG. 8D but the sample tabs are replaced by indents, or notches, in the bridging and outer arm material. Other variations are possible and include, for example, using a combination of tabs and indents.

Figure 8F:
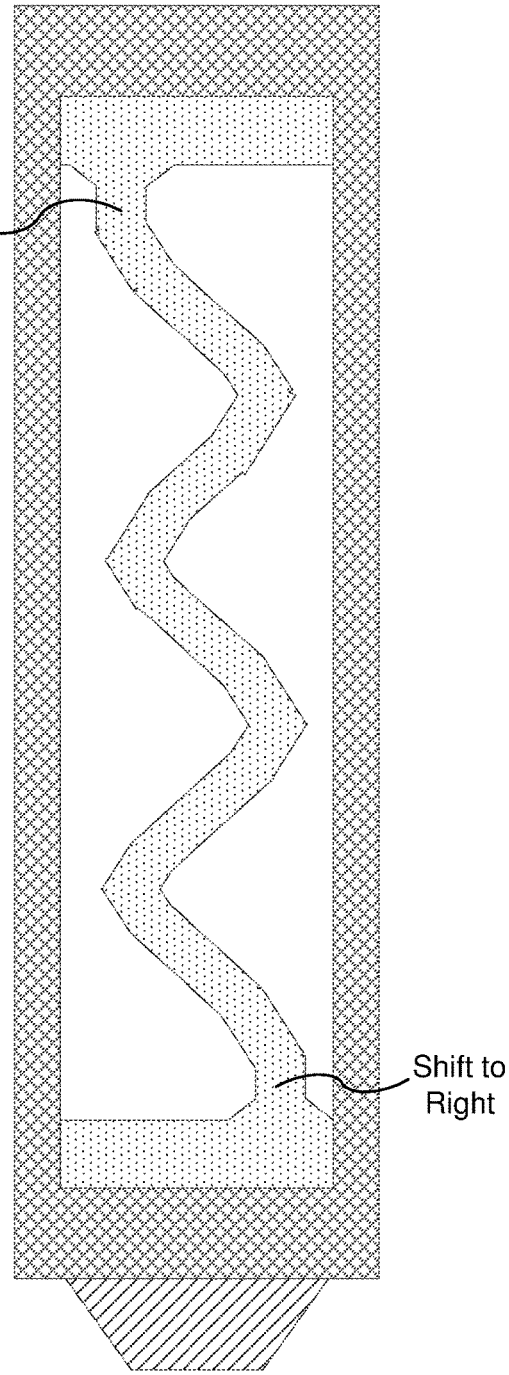

FIG. 8F provides an example probe similar to FIGS. 8D and 8E with the exception that tabs and notches are removed but the intermediate arm is provided with end mounting locations that are offset to opposite sides of the center line of the probe (in X) as opposed to being centered between the two outer arms (i.e. located along a center line of the probe in X).

Figure 8G:
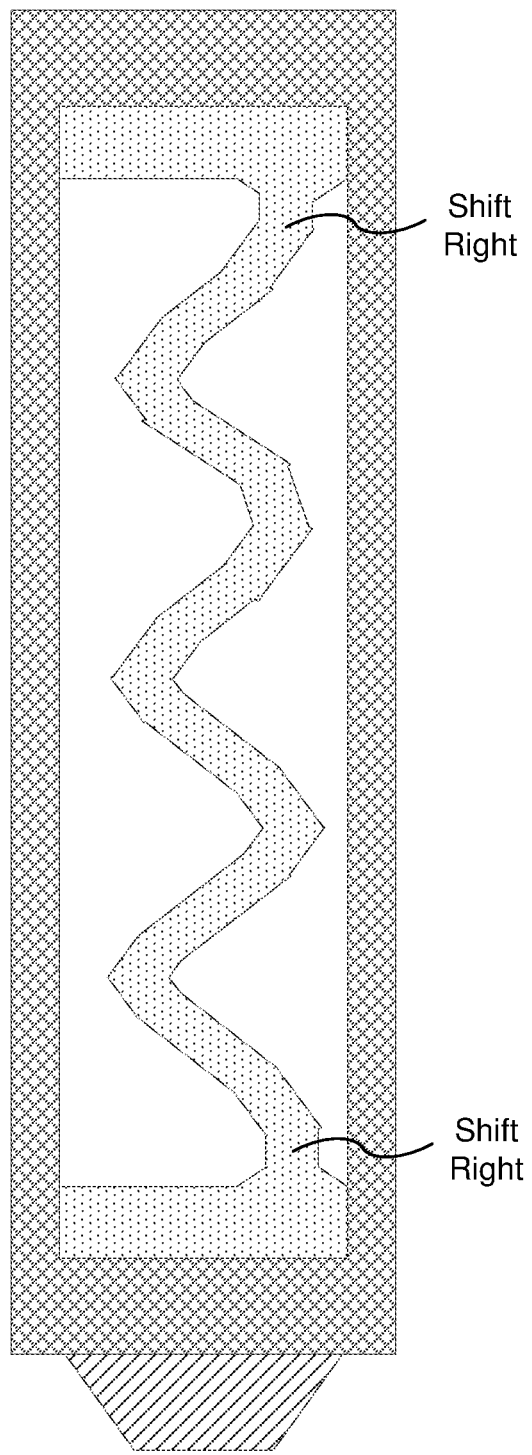

FIG. 8G provides an example probe similar to that of FIG. 8F with the exception that end mounting locations of the intermediate arm are not offset to opposite sides of the probe center (in X) but are offset to a single side of the probe center.

Figure 9A:
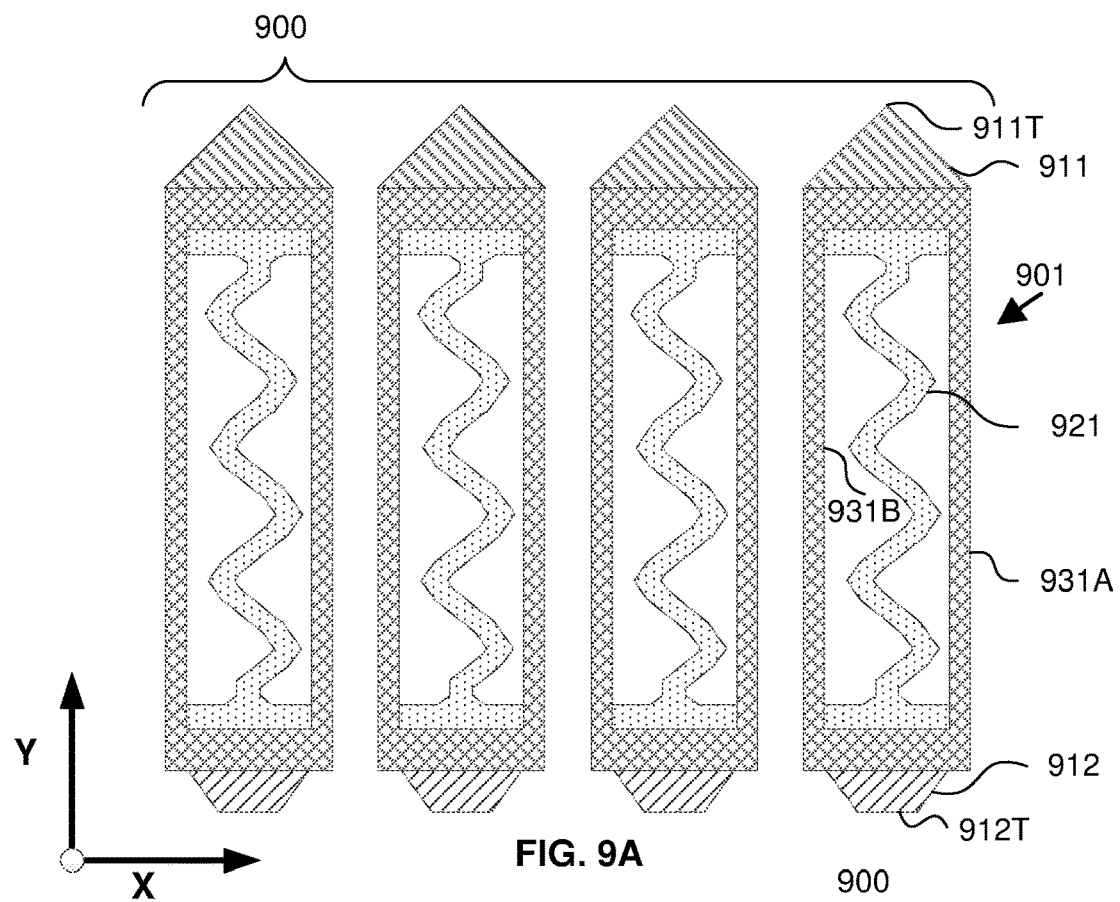
FIGS. 9A-9C provide a front view, a side view, and a top view, respectively, of an example 4-by-8 array of probes without showing array retention structures (e.g., substrates, guide plates, or other frame structures) where the probes are similar to the probe of FIGS. 6A-6B3.
Figure 9B:
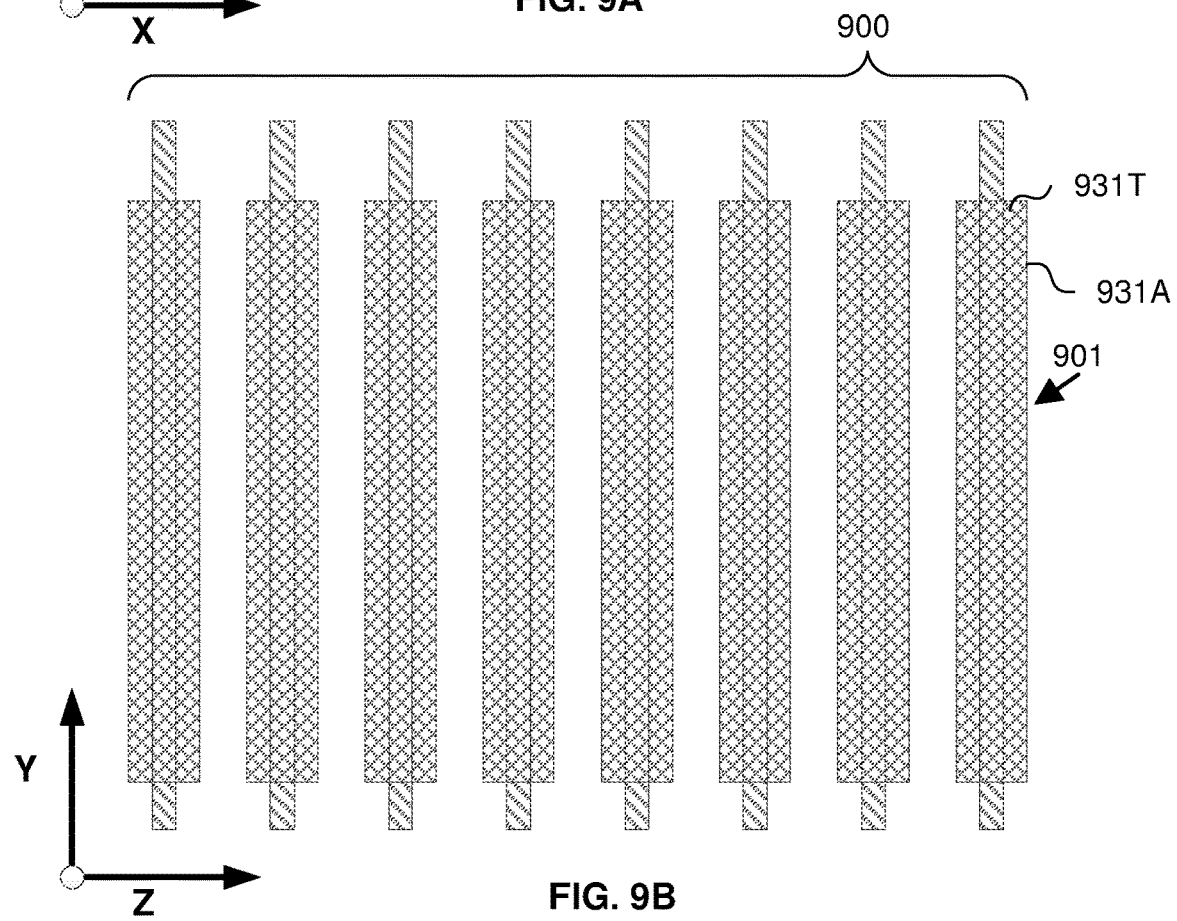
Figure 9C:
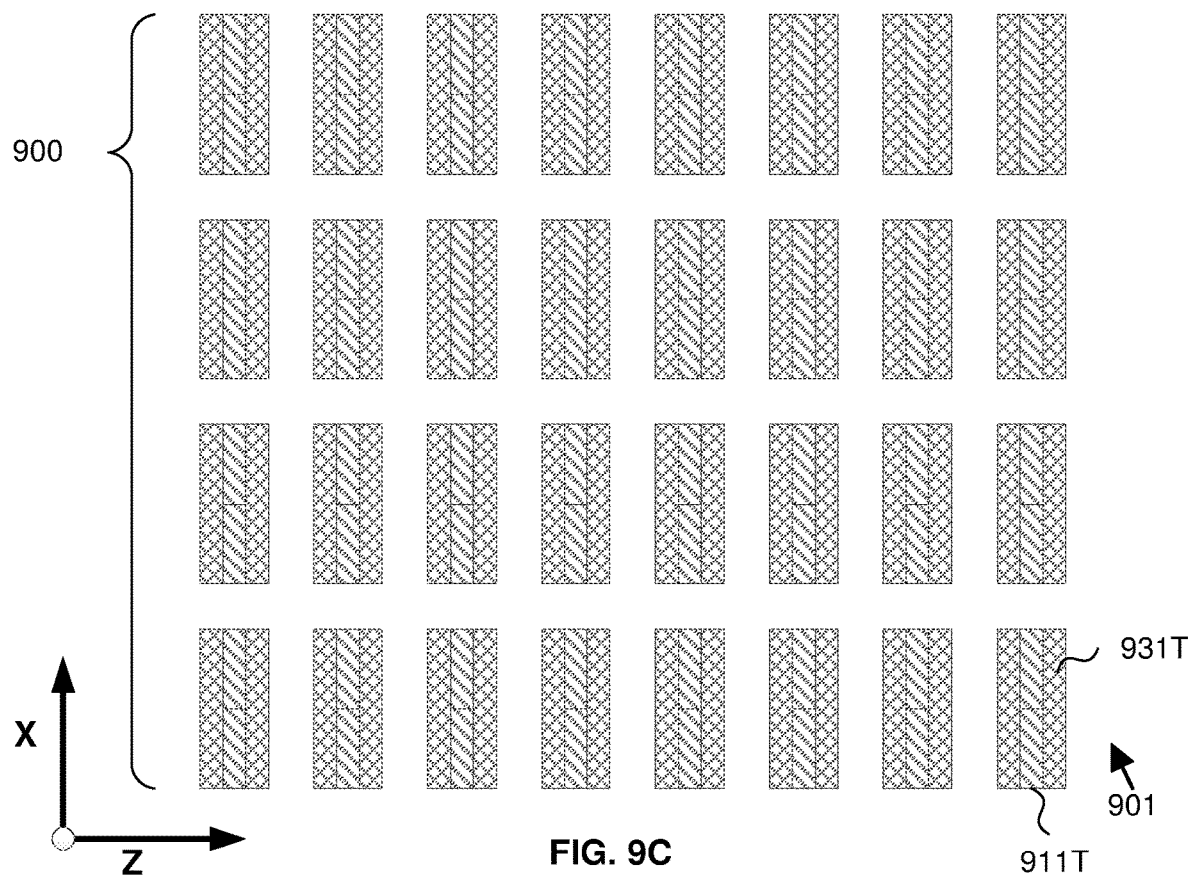

FIGS. 9A-9C provide a front (X-Y) view, a side (Y-Z) view, and a top (X-Z) view, respectively, of an example 4-by-8 array 900 of probes 901 without showing array retention structures (e.g., substrates, guide plates, or other frame structures) where the probes are similar to the probe of FIGS. 6A-6B3. Each probe includes a first end 911 and first tip 911T, a second end 912 and second tip 912T, at least one intermediate arm 921, at least a first outer arm 931A and a second outer arm 931B wherein the at least one intermediate arm is formed of a different material than that used on either of the first outer arm or the second outer arm as well as that used as a contact material as part of the first tip or the second tip. In the present embodiment, the longitudinal axis of the probes is the Y-axis while the layer stacking direction for probe formation is the Z-axis. In some variations, other build orientations may be used. Numerous other variations are also possible including, for example: (1) the probes having other configurations, (2) the probes using a different number of materials, (3) the materials having different properties, (4) the probes used in the array having more than one configuration, (5) the array having different uniform or non-uniform probe spacings or pitches, (6) the array using a different number of probes, and (7) tip material being or not being partially embedded or otherwise interlocked with the material of the outer arms or the material of the intermediate arm. FIG. 9C shows the tip ends 911T of each of the thirty-two probes in the array 900 along with the ends 931T of the adjoining layers of outer arm material (e.g., spring material) 931A and 931B which sandwich a portion of the tip region as exemplified in FIGS. 6B1-6B3.

Figure 10:
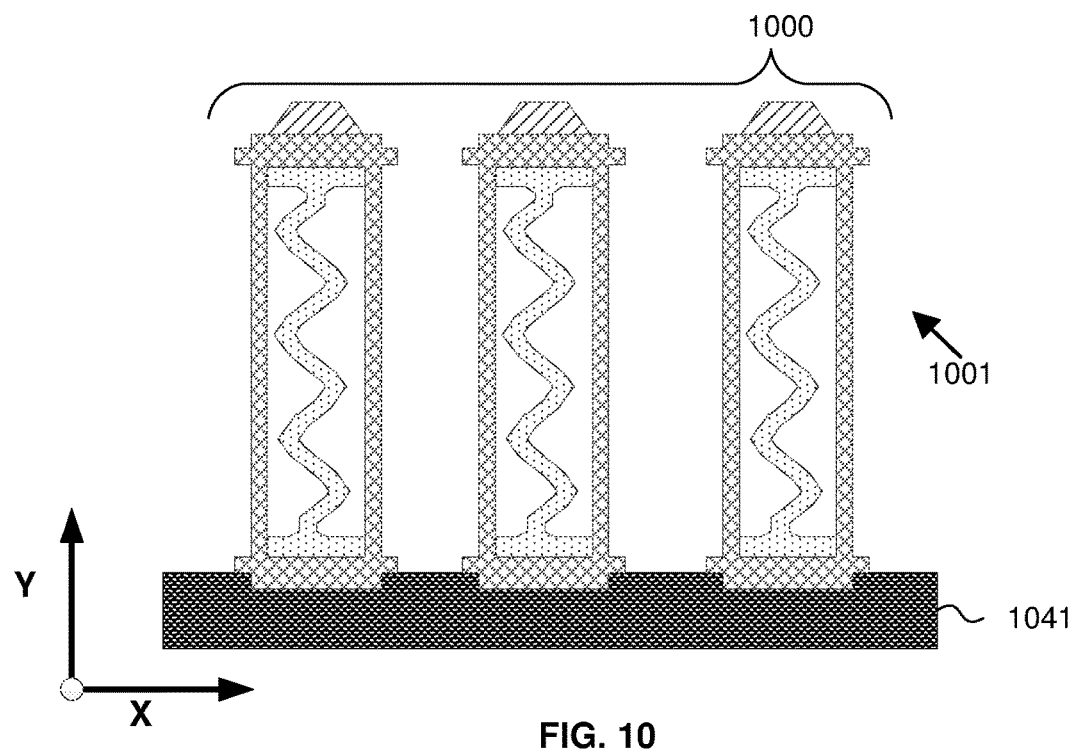
FIG. 10 provides a front view of an array with three probes shown that are similar to the probe of FIG. 8D which are held in an array configuration by a substrate (e.g., a space transformer or via substrate) to which the probes are mounted.

FIG. 10 provides a front view of an array 1000 with three probes 1001 shown that are similar to the probe of FIG. 8D which are held in an array configuration by a substrate 1041 (e.g., a space transformer or via substrate) to which the probes are mounted. As with the other embodiments, numerous variations of the embodiment of FIG. 10 are possible and include, for example: (1) use of different numbers of probes, (2) probes with different configurations, (3) probes bonded to the substrate via solder, ultrasonic bonding, laser welding, wedging or press fitting into openings in the substrate, or the like, (4) use of multi-part substrates, (5) use of substrates with different thicknesses, (6) use of different substrate configurations, and (7) use of single material or multi-material substrates with or without conductive vias, with or without through holes, without or without shielding, and the like.

Figure 11:
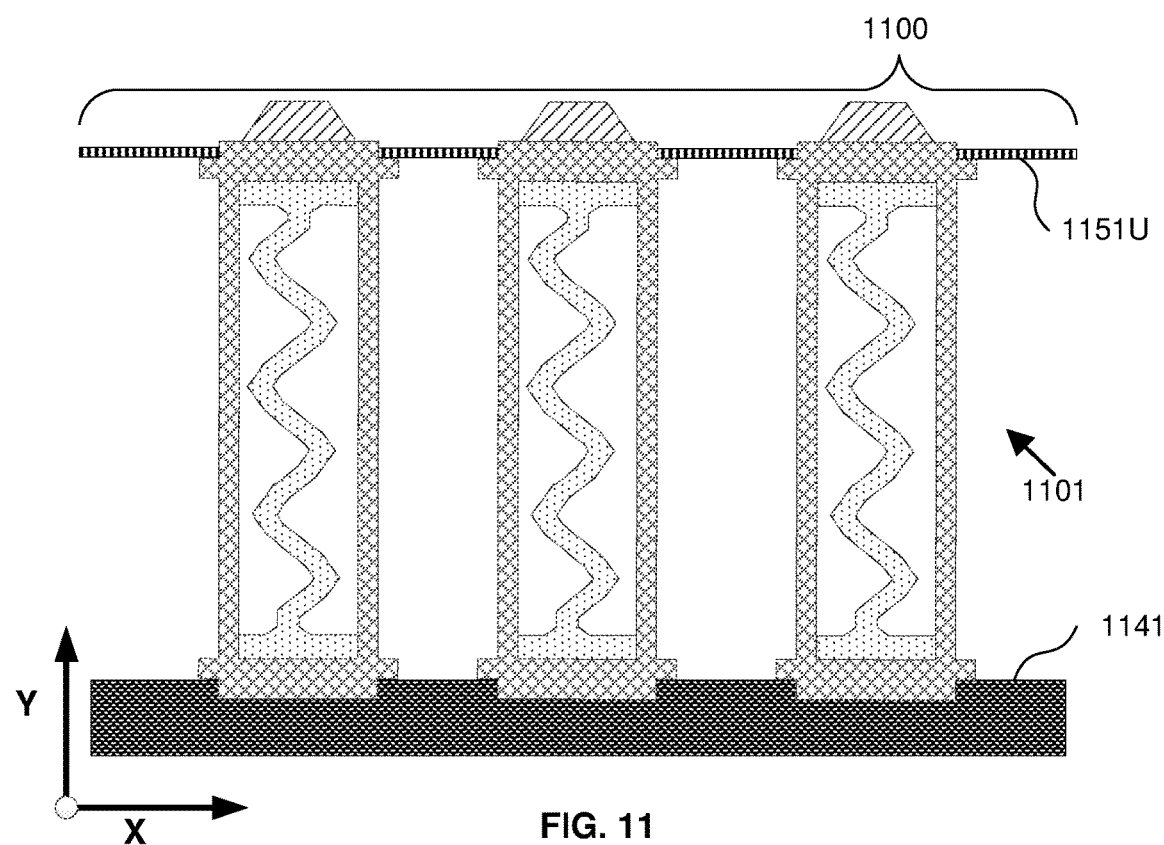
FIG. 11 provides a front view of an array similar to that of FIG. 10 but where, in addition to a substrate-type array retention structure, an upper guide plate is provided.

FIG. 11 provides a front view of an array 1100 similar to that of FIG. 10 but where, in addition to a substrate array retention structure 1141, an upper guide plate 1151U is provided to aid in retaining and positioning the probes 1101. As with the other embodiments herein, numerous variations are possible and include for example use of more than one guide plate.

Figure 12:
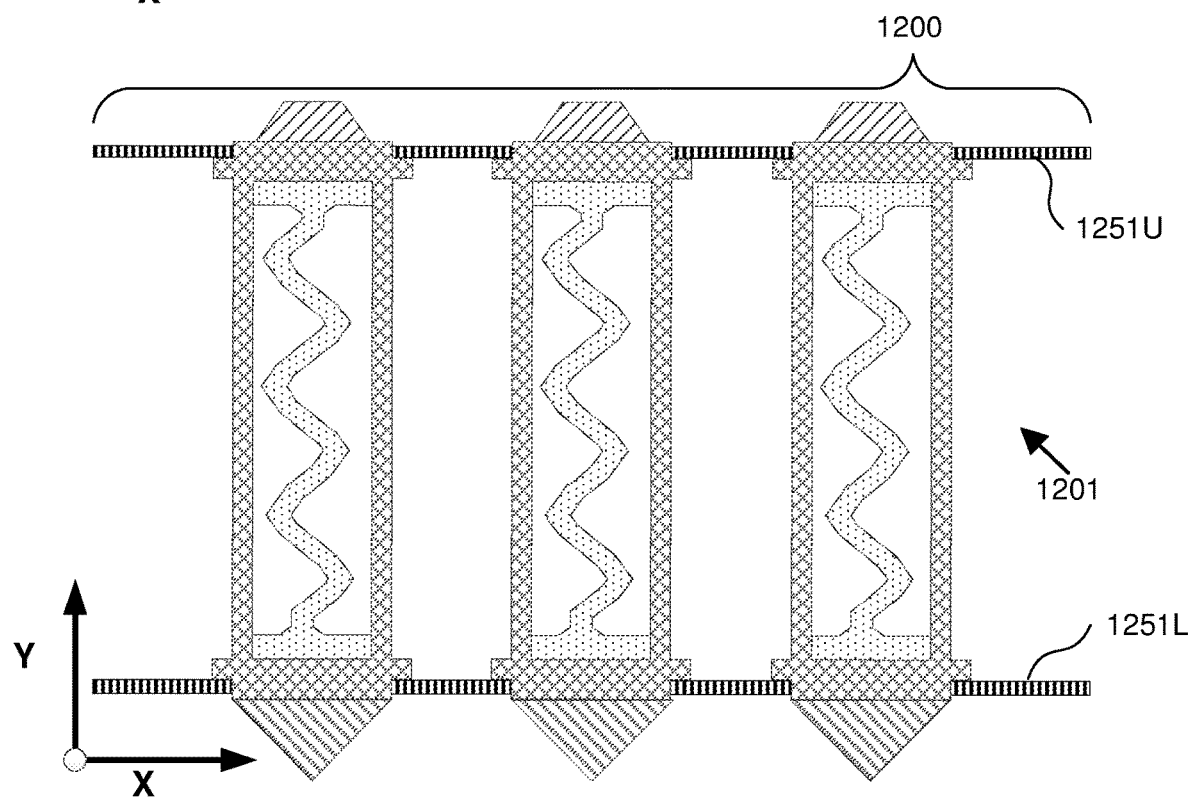
FIG. 12 provides a front view of an array similar to that of FIG. 11 but with the array substrate replaced by a lower guide plate.

FIG. 12 provides a front view of an array 1200 of probes 1201 similar to that of FIG. 11 including an upper guide plate 1251U but with the substrate replaced by a lower guide plate 1251L. As with the other embodiments set forth herein, numerous variations of the embodiment of FIG. 12 are possible.

Figure 13A:
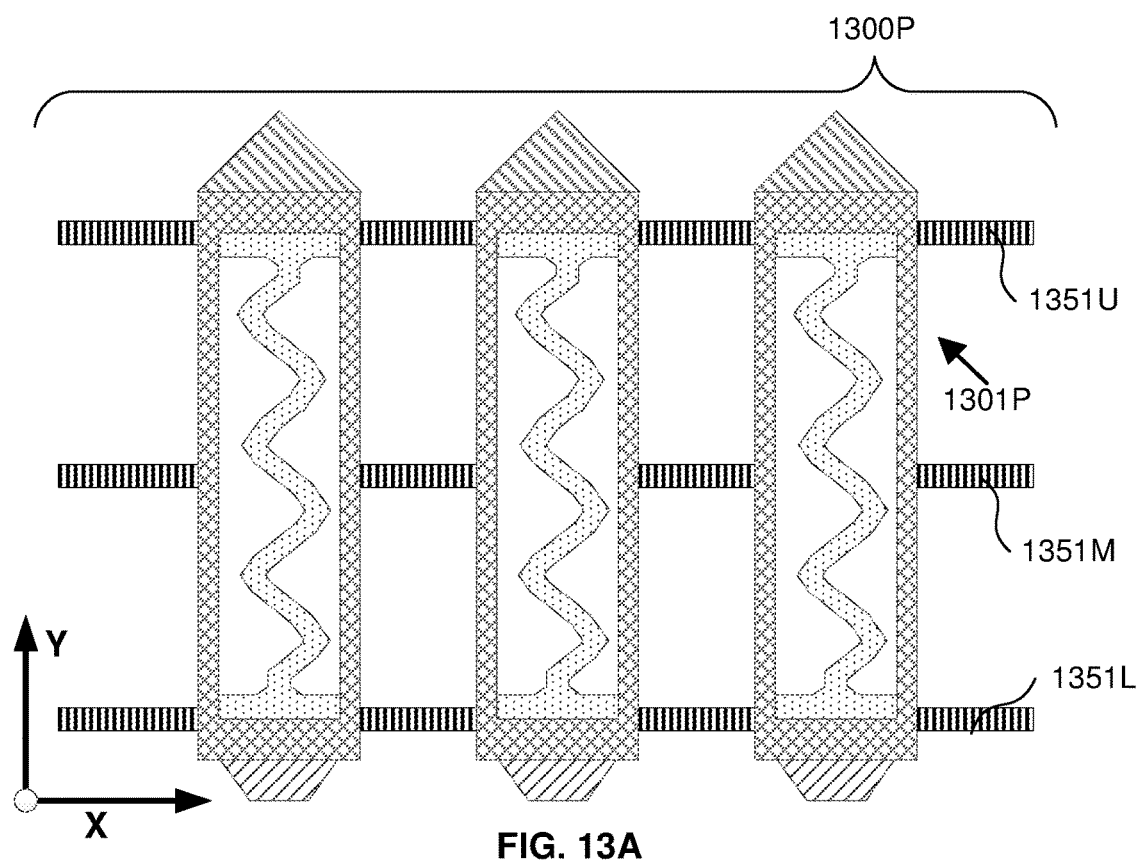
FIGS. 13A-13C illustrate formation of another example array with three probes shown at different states of processing with the probes similar to the probe of FIG. 6A but where the probes are plastically deformed while in an array configuration using three guide plates or deformation plates to provide the probes with a configuration similar to that of FIG. 8A.
Figure 13B:
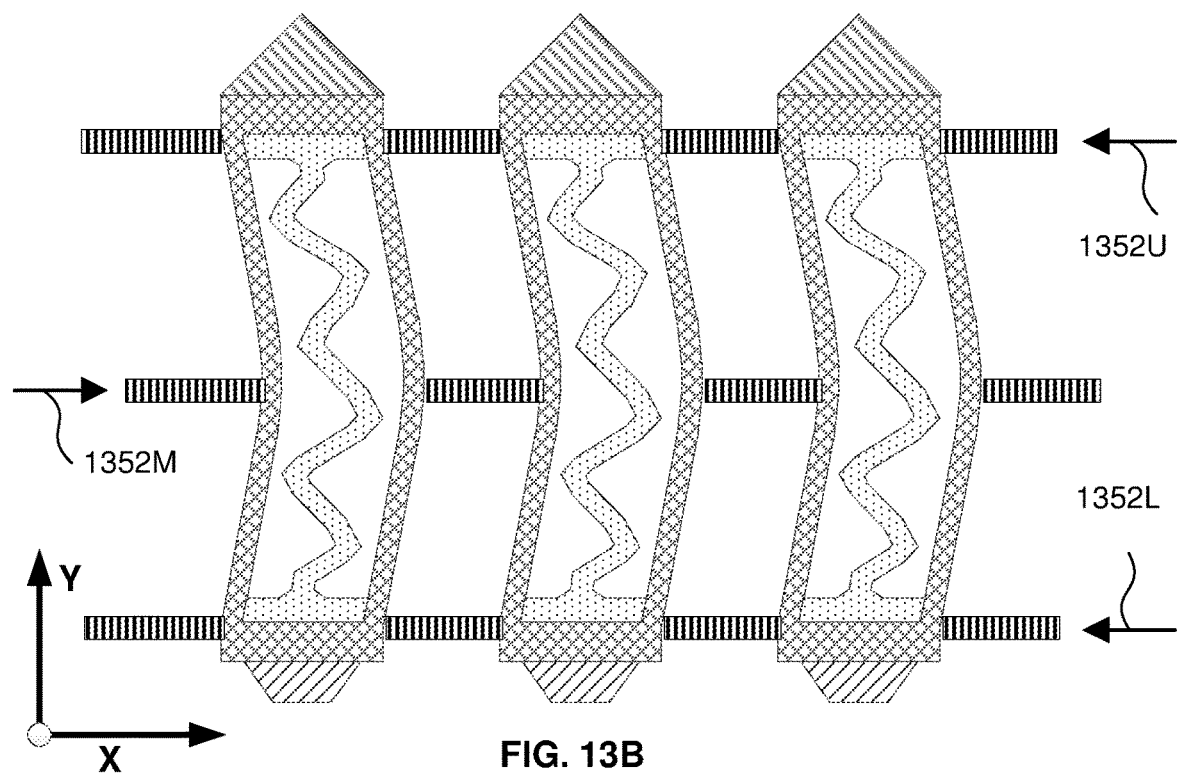
Figure 13C:
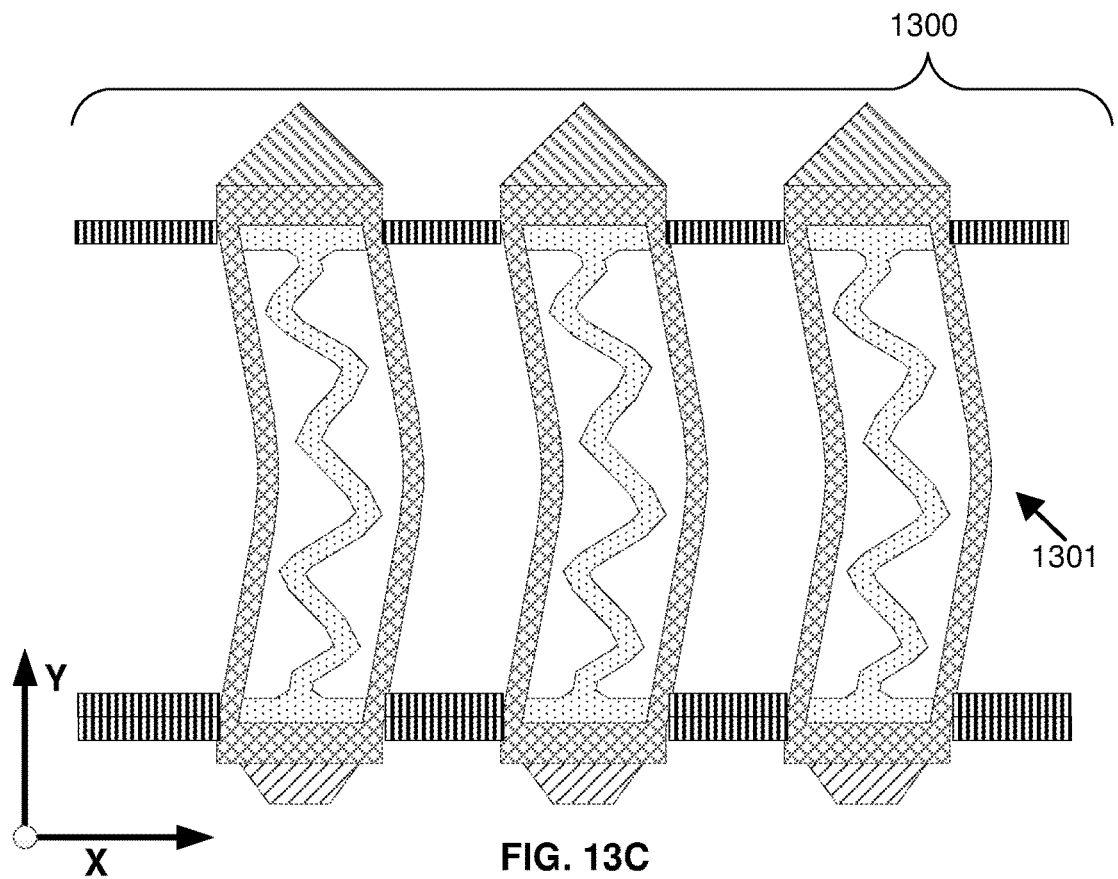

FIGS. 13A-13C illustrates formation of another example array 1300 with three probes 1301 shown with each figure showing a different state of processing where the probes are similar to the probe of FIG. 6A but where the probes are plastically deformed while in an array configuration using three guide plates or deformation plates 1351U, 1351L, and 1351M to provide the probes with a configuration similar to that of FIG. 8A. FIG. 13A shows the state of the process after probe preforms 1301P are formed and positioned within openings in the three guide plates to form a preform array 1300P. FIG. 13B shows the state of the process after the middle or intermediate guide plate 1351M is moved to the right relative to the upper and lower guide plates 1351U and 1351L to cause plastic deformation of the probes as can be seen by arrow 1352U, 1352L, and 1352M. FIG. 13C shows the state of the process after the middle guide plate is moved to a position adjacent to or in proximity to the lower guide plate. In some variations, the lower and intermediate guides when placed in proximity to each other may be slightly laterally shifted to aid in securing the probes and the guides together while still allowing some amount of longitudinal movement of the lower probe tips. In some variations, the intermediate guide plate may be located at a different longitudinal level to cause bending at a different location. In still other variations, the intermediate and/or other guide plates may be moved to different longitudinal levels in a serial fashion to create more than a single bending in the probes based on a series of bending operations. In still further variations, more than three guide plates may be used for retention purposes and/or for simultaneous multiple level deformation or bending of the probes.

Figure 14:
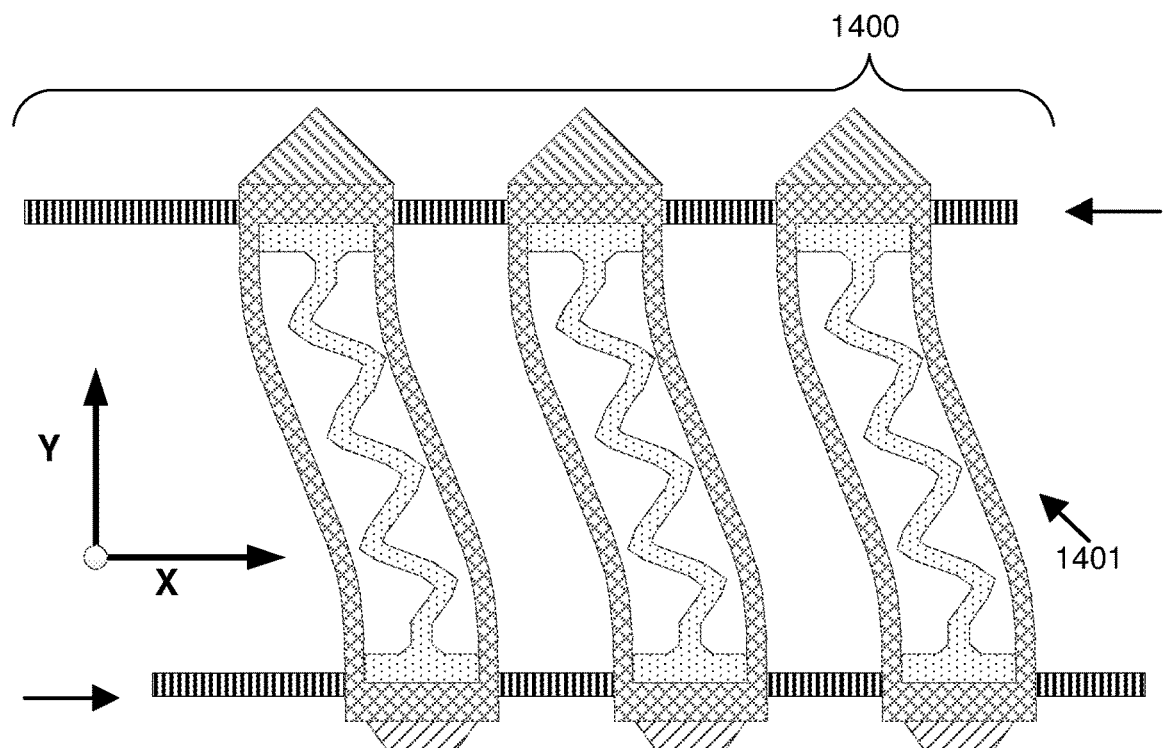
FIG. 14 provides another example array with three probes having configurations similar to that of the probe of FIG. 8B where the probes may be formed with such configurations or where they may be formed with configurations similar to that of the probe of FIG. 6A and then deformed once combined with array retention structures.

FIG. 14 provides another example array 1400 with three probes 1401 having configurations similar to that of the probe of FIG. 8B where the probes may be formed with such configurations or where they may be formed with configurations similar to that of the probe of FIG. 6A and then deformed once combined with array retention or shaping structures. As with the other embodiments set forth herein, numerous variations of the array illustrated in this embodiment are possible.

Figure 15A:
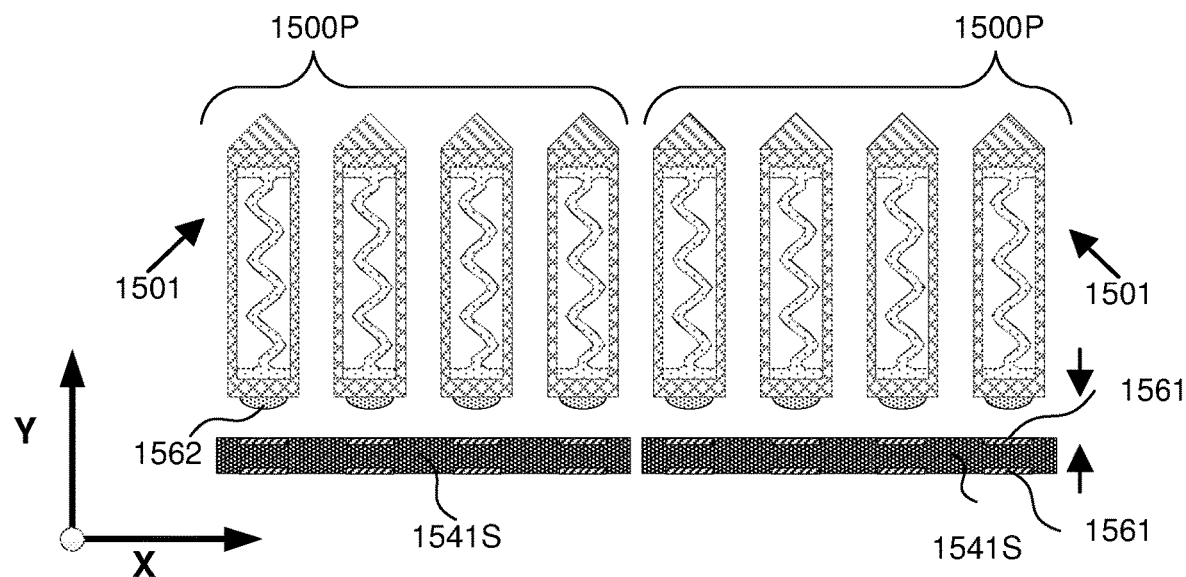
FIGS. 15A-15D illustrate different states in a process for creating a tiled probe array from a plurality of subarrays where the final array may or may not include a guide plate in addition to the subarray substrates and an overall array substrate.
Figure 15B:
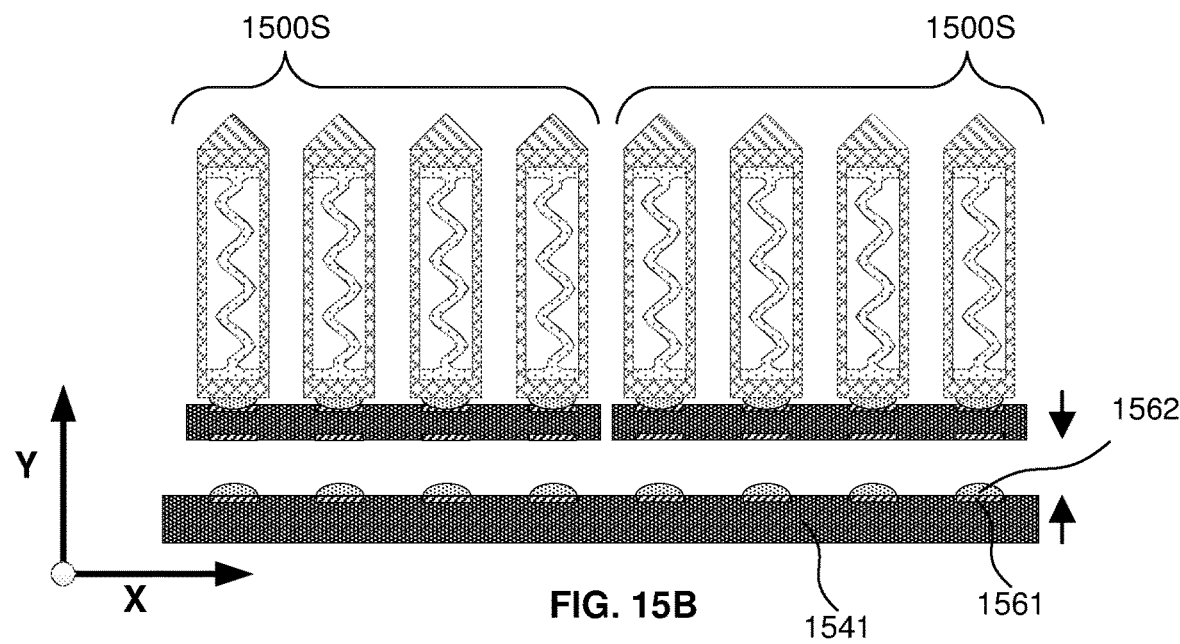
Figure 15C:
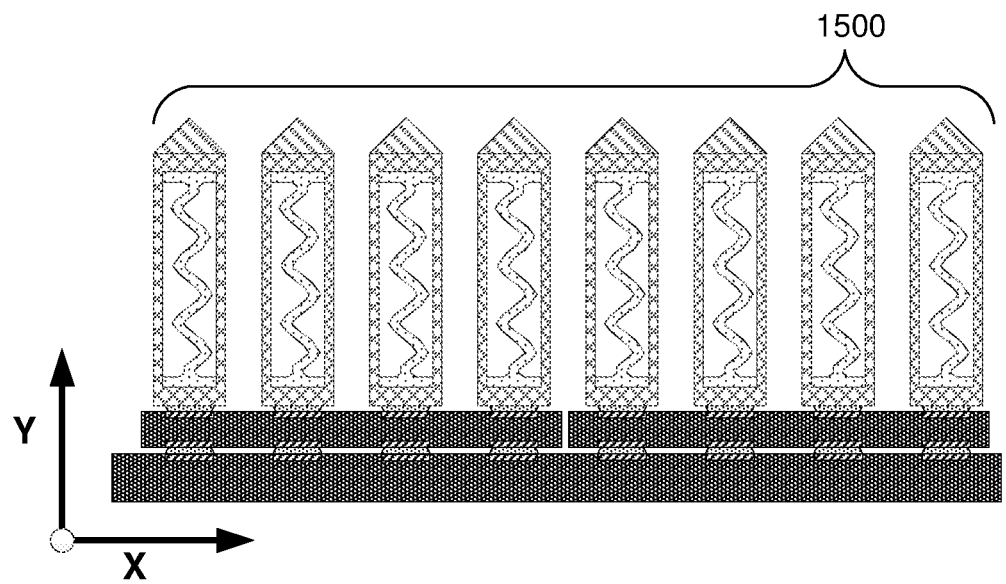
Figure 15D:
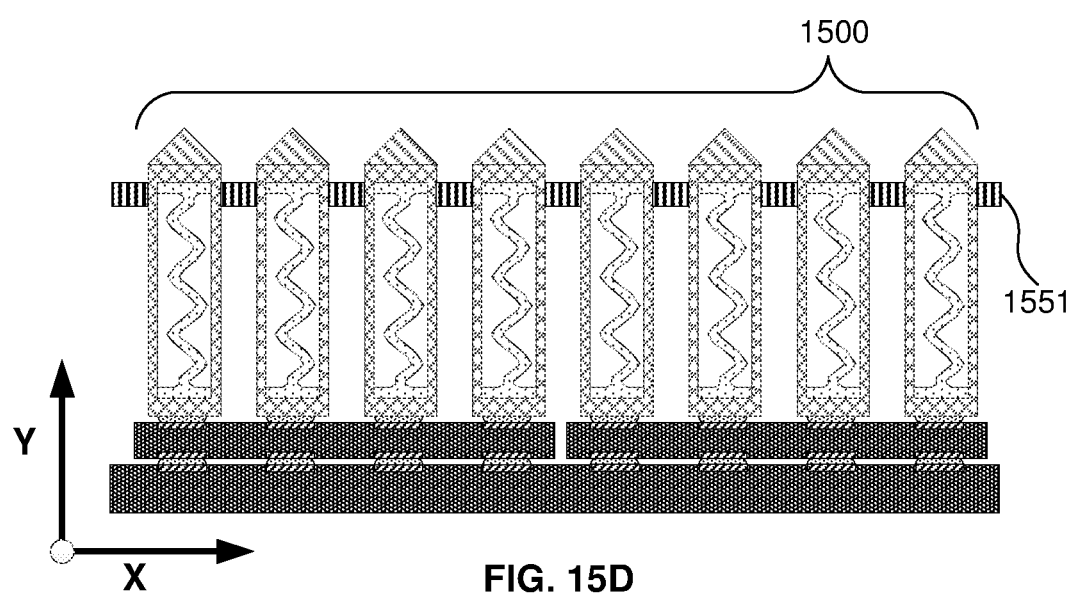

FIGS. 15A-15D illustrate different states in a process for creating a tiled probe array 1500 from a plurality of subarrays 1500S (two in the embodiments as illustrated) where the final array may or may not include a guide plate in addition to the overall array substrate or 1541 and subarray substrates 1541S. Each subarray substrate and the overall array substrate are shown with bonding pads 1561 and the probes 1501 and/or substrates are also shown as carrying a bonding material (e.g., solder) 1562 which can be made to cause bonding of the probes to the subarray substrates or the subarray substrates to the overall array substrate as necessary. FIG. 15A depicts the state of the process after probes 1501 in array positions 1500P are positioned laterally over two separate subarray substrates 1541S in preparation for longitudinal movement toward the subarray substrates and bonding thereto at the bonding pads 1561 using the bonding material 1562 provided on the lower ends of the probes. FIG. 15B depicts the state of the process after the probes and subarray substrate have been bonded and laterally aligned with an overall array substrate for subsequent longitudinal movement and bonding of the subarray substrates to the overall array substrate via the bonding material 1562 on the pads of the overall array substrate. FIG. 15C shows the state of the process after the bonding of the subarray substrates and the overall substrate is completed. FIG. 15D shows an optional state of the process where an upper guide plate 1551 has been added as part of the array retention elements. As with the other embodiments numerous alternatives to the embodiment illustrated in FIGS. 15A-15D are possible and include use of a frame instead of an overall array substrate where the frame and/or subarrays substrates have border regions and/or features for engaging the features of the other array structures to provide for a stable and functional array. In still other variations, the subarray substrates may be replaced with other array structures such that bonding or aligned engagement of subarray groups of probes occurs in an overall array configuration without necessarily including a substrate to which probes are bonded.

Further Comments and Conclusions

In addition to the probe variations referenced above, probe structures may take on a variety of different forms, be formed using different processes, and be made to contain a variety of different materials to improve overall probe and array functionality. In some embodiments, dielectrics may be incorporated into the probes and/or array structures to aid in ensuring electrical isolation between individual probes, groups of probes, or between separated conductive paths within single probes. Examples of such forms and processes can be found in the patents and applications set forth in the following paragraphs and in the following table as well as in various patents and applications set forth herein above. All such patents and applications are incorporated herein by reference.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (5) U.S. patent application Ser. No. 11/325,405, filed Jan. 3, 2006 by Dennis R. Smalley, now abandoned, and entitled "Method of Forming Electrically Isolated Structures Using Thin Dielectric Coatings"; (6) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (7) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (8) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (9) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. patent application Ser. No., Filing Date U.S. application Pub No., Pub Date U.S. Pat. No., Pub Date | First Named Inventor, Title |
|---|---|
| 10/271,574 - Oct. 15, 2002 2003-0127336 - Jul. 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |
| 10/434,289 - May 7, 2003 20040065555 - Apr. 8, 2004 — | Zhang, "Conformable Contact Masking Methods and Apparatus Utilizing In Situ Cathodic Activation of a Substrate" |
| 10/434,294 - May 7, 2003 2004-0065550 - Apr. 8, 2004 — | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 — | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 — | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 USP 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some method of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, or rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference), and they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. Furthermore, alternatives acknowledged in association with one embodiment, are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A vertical probe, comprising:
   (a) a first end portion comprising a contact region;
   (b) a second end portion, different from the first end portion; and
   (c) a central portion extending longitudinally and connecting the first and second end portions, wherein the central portion comprises at least three compliant arms separated from one another by at least one gap wherein the arms bend under load and run longitudinally, wherein a cross-section taken perpendicular to a local longitudinal direction in the central portion encounters each of the at least three compliant arms,
      wherein the at least three compliant arms comprise at least first and second outer arms that bend elastically and at least one intermediate arm located at a position that is at least partially between the first and second outer arms, wherein each of the first and second outer arms comprise a first material having a first yield strength while the intermediate arm comprises a second material having a second yield strength which is lower than the first yield strength, and
      wherein the first material having the first yield strength comprises a material selected from a group consisting of: (1) nickel, (2) nickel-cobalt, (3) nickel-phosphor, (4) palladium, (5) beryllium-copper, (6) tungsten, (7) titanium, (8) nickel-tungsten, (9) palladium-rhenium, (10) an alloy of nickel, and (11) an alloy of palladium.

2. The probe of claim 1, wherein the second material having the second yield strength is a highly conductive material having a higher conductivity than the first material having the first yield strength.

3. The probe of claim 2, wherein the second material having the second yield strength comprises a material selected from a group consisting of: (1) copper, (2) gold, (3) silver, (4) an alloy of copper, (5) an alloy of gold, and (6) an alloy of silver.

4. The probe of claim 1, wherein the contact region comprises a first tip material different from the first material with the first yield strength.

5. The probe of claim 4, wherein the first tip material comprises a material selected from a group consisting of: (1) rhodium, (2) rhenium, (3) tungsten, and (4) tungsten carbide.

6. The probe of claim 1, wherein the probe is formed from at least one layer of at least one material.

7. The probe of claim 1, wherein the probe comprises a plurality of layers of material.

8. The probe of claim 7, wherein each layer is a substantially planar layer and wherein each layer is defined by one or more materials located between an upper and lower boundary level of a longitudinal cross-section of the probe.

9. The probe of claim 8, wherein a bending plane for the probe, when in use, is a plane parallel to a plane of the at least one layer.

10. The probe of claim 1, wherein the at least one intermediate arm comprises a plurality of intermediate arms.

11. The probe of claim 1, wherein the outer arms of the probe are substantially linear prior to mounting or loading the probe into an array configuration.

12. The probe of claim 1, wherein the outer arms are curved prior to mounting them to a substrate.

13. The probe of claim 1, wherein the outer arms are curved prior to loading them into array guide plates.

14. The probe of claim 1, wherein the two outer arms have an average radius of curvature along their longitudinal lengths that are larger than an average radius of curvature along a longitudinal length of the intermediate arm.

15. The probe of claim 1, wherein a configuration and positioning of the intermediate arm provides all portions of the intermediate arm, over the entire range of motion of the probe while in use, to a limited stress level on the second material having the second yield strength that is selected from a group consisting of: (1) less than an ultimate strength of the material having the second yield strength; (2) less than the second yield strength of the second material; (3) less than 80% of the second yield strength of the second material; (4) less than 65% of the second yield strength of the second material; and (5) less than 50% of the second yield strength of the second material.

16. A two-dimensional probe array for testing a DUT, comprising:
   (a) at least one array structure having a plurality of openings;
   (b) a plurality of vertical probes with each inserted into an opening in the at least one array structure, wherein each vertical probe comprises:
      (i) a first end portion comprising a contact region;
      (ii) a second end portion, different from the first end portion; and
      (iii) a central portion extending longitudinally and connecting the first and second end portions, wherein the central portion comprises at least three compliant arms separated from one another by at least one gap wherein the arms bend under load and run longitudinally, wherein a cross-section taken perpendicular to a local longitudinal direction in the central portion encounters each of the at least three compliant arms, wherein the at least three compliant arms comprise at least first and second outer arms that bend elastically and at least one intermediate arm located at a position that is at least partially between the first and second outer arms, wherein each of the first and second outer arms comprise a first material having a first yield strength while the intermediate arm comprises a second material having a second yield strength which is lower than the first yield strength, and wherein the first material of first and second outer arms having the first yield strength comprises a material selected from a group consisting of: (1) nickel, (2) nickel-cobalt, (3) nickel-phosphor, (4) palladium, (5) beryllium-copper, (6) tungsten, (7) titanium, (8) nickel-tungsten, (9) palladium-rhenium, (10) an alloy of nickel, and (11) an alloy of palladium.

17. The array of claim 16, wherein a nominal pitch for tip-to-tip spacing in a first dimension, perpendicular to a second dimension, is (i) same as a nominal tip-to-tip pitch in the second dimension, (ii) between ⅕ and 5 times the nominal tip-to-tip pitch in the second dimension; (iii) between ⅓ and 3 times the nominal tip-to-tip pitch in the second dimension; (iv) between ½ and 2 times the nominal tip-to-tip pitch in the second dimension.

18. The array of claim 16, wherein the array structure comprises two array structures both with a plurality of openings and with the two structures forming at least part of an assembly for holding probes such that each of a plurality of probes extends through each of the two array structures.

19. The array of claim 16, wherein the array structure further comprises at least two subarray substrates to be bonded with respective groups of probes to form at least two subarrays of probes, which are in turn bonded to an overall array substrate.

20. The array of claim 16, wherein the second material having the second yield strength of the intermediate arm is a highly conductive material having a higher conductivity than the first material having the first yield strength.

21. The array of claim 16, wherein the second material having the second yield strength of the intermediate arm comprises a material selected from a group consisting of: (1) copper, (2) gold, (3) silver, (4) an alloy of copper, (5) an alloy of gold, and (6) an alloy of silver.

* * * * *